United States Patent
Mori et al.

(10) Patent No.: US 7,034,857 B2
(45) Date of Patent: *Apr. 25, 2006

(54) LIGHT AND THERMAL ENERGY IMAGE-RECORDING APPARATUS

(75) Inventors: Nobufumi Mori, Kanagawa (JP); Akinori Harada, Kanagawa (JP); Shintaro Washizu, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 632 days.

This patent is subject to a terminal disclaimer.

(21) Appl. No.: 09/845,322

(22) Filed: May 1, 2001

(65) Prior Publication Data

US 2002/0001028 A1    Jan. 3, 2002

(30) Foreign Application Priority Data

May 1, 2000  (JP) ............................. 2000-132547
May 1, 2000  (JP) ............................. 2000-132642

(51) Int. Cl.
*B41J 2/435* (2006.01)
*B41J 2/385* (2006.01)

(52) U.S. Cl. .................................. 347/228; 347/156

(58) Field of Classification Search ............ 347/140, 347/155–158, 165, 228, 212, 172, 224–225; 430/138, 139, 170, 328, 336, 350, 202, 352, 430/566, 455–459, 464, 503; 355/27, 405–406; 399/53, 67

See application file for complete search history.

(56) References Cited

U.S. PATENT DOCUMENTS

| | | | | |
|---|---|---|---|---|
| 4,207,112 A | * | 6/1980 | Ikenoue et al. | 430/566 |
| 4,332,884 A | * | 6/1982 | Uji-Ie et al. | 430/338 |
| 4,734,704 A | * | 3/1988 | Mizutani et al. | 347/173 |
| 4,785,332 A | | 11/1988 | Nagumo et al. | 355/406 |
| 4,810,603 A | | 3/1989 | Okino | 430/30 |
| 4,868,089 A | * | 9/1989 | Kobayashi et al. | 430/203 |
| 4,920,376 A | * | 4/1990 | Yamamoto | 355/38 |
| 4,958,233 A | | 9/1990 | Okino | 358/302 |
| 5,040,018 A | | 8/1991 | Kawada et al. | 355/28 |
| 5,073,791 A | * | 12/1991 | Mouri et al. | 355/27 |
| 5,216,438 A | * | 6/1993 | Nakao et al. | 347/172 |
| 5,264,316 A | | 11/1993 | Yamada et al. | 430/138 |
| 5,374,496 A | * | 12/1994 | Kagami et al. | 430/202 |

(Continued)

FOREIGN PATENT DOCUMENTS

EP    0 412 570 A2    2/1991

(Continued)

OTHER PUBLICATIONS

Publication No. U.S. 2002/0018188 A1, "Image-Recording Apparatus", by Mori et al., (U.S. Appl. Ser. No. 09/844,276, filed Apr. 30, 2001).*

*Primary Examiner*—Hai Pham
(74) *Attorney, Agent, or Firm*—Sughrue Mion, PLLC

(57) ABSTRACT

An image-recording apparatus. In a housing of the apparatus are a casing section that encases a light and heat sensitive recording material, an optical recording section that exposes the light and heat sensitive recording material fed from the casing section to record a latent image, a thermal developing section that develops the latent image by heating, an optical fixing section that fixes the developed image by irradiating it with light, and an outlet through which the image-recorded material is taken out.

90 Claims, 6 Drawing Sheets

U.S. PATENT DOCUMENTS

| | | | |
|---|---|---|---|
| 5,866,293 A * | 2/1999 | Nomura et al. | 430/138 |
| 6,218,068 B1 | 4/2001 | Tanaka et al. | 430/138 |
| 6,303,259 B1 * | 10/2001 | Kubo et al. | 430/138 |
| 6,340,561 B1 * | 1/2002 | Naruse et al. | 430/503 |
| 6,395,466 B1 * | 5/2002 | Katoh et al. | 430/619 |
| 6,499,893 B1 * | 12/2002 | Harada et al. | 396/575 |

FOREIGN PATENT DOCUMENTS

| | | | |
|---|---|---|---|
| JP | 57-5044 | * | 1/1982 |
| JP | 63-199346 | | 8/1988 |

* cited by examiner

F I G. 1 0
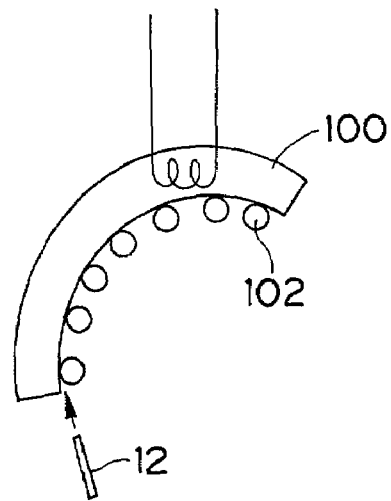
F I G. 1 1
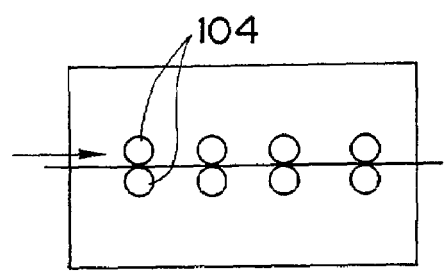
F I G. 1 2
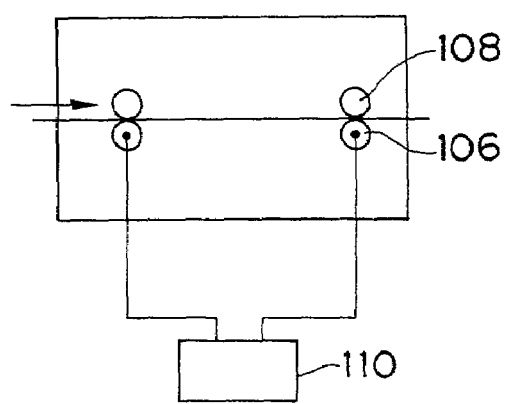

LIGHT AND THERMAL ENERGY IMAGE-RECORDING APPARATUS

BACKGROUND OF THE INVENTION

1. Field of the Invention

The present invention relates to an image-recording apparatus, more precisely to an image-recording apparatus for recording an image on a light and heat sensitive recording material.

2. Description of the Related Art

In conventional photo-recording systems such as, typically, those for silver photography, films such as negative or positive films are exposed to light to form images thereon, and then developed. The image information thus recorded on the developed films is optically printed on printing paper, which is then processed with a processing solution to obtain prints. Color negative films generally have a layer to be exposed to blue light to form a yellow color image thereon, a layer to be exposed to green light to form a magenta color image thereon, and a layer to be exposed to red light to form a cyan color image thereon. In a developing process, latent image-bearing silver halide grains in the film are reduced to silver while a developer used is oxidized, and the oxidized product is reacted with a coupler (coupling reaction) to form a color image. The non-developed silver halides and the developed silver are removed with a bleach-fixer in a bleach-fixing process that follows the developing process. Then, color printing paper is exposed to light through the resulting negative color image, and developed, bleached and fixed in the same manner as above to obtain a color print. Hence, most conventional photo-recording systems are wet systems that use processing solutions. Therefore, processing apparatuses are large, and processing costs are often high.

Regarding silver halide photographic materials, a range of short wavelengths of not longer than 450 nm corresponds to the basic absorption range for silver halides therein; and light within this short wavelength range could not be used in recording images on silver halide photographic materials. Therefore, for silver halide photographic materials, wavelength separation latitude could not be sufficiently broadened. For this reason, it has heretofore been difficult to design color photographic materials for recording with lights of three colors, red, green and blue, without problems of color mixing in recorded images.

On the other hand, a simple and rapid method has been developed for processing silver halide photographic materials through thermal development. For this method, some systems are commercially available on the market, such as 3M's DRY SILVER and Fuji Photo Film's PICTROGRAPHY and PICTROSTAT. However, this method of thermal development requires a process of transferring dyes formed through thermal development onto an image-receiving material to give prints, and a drawback is that it produces waste material.

SUMMARY OF THE INVENTION

The present invention is provided to solve the above-mentioned problems, and one object thereof is to provide an image-recording apparatus for a completely dry system that does not leave wastes. Another object is to provide an image-recording apparatus capable of forming an image-recording system with good color reproduction.

In order to achieve the above objects, one aspect of the present invention is an image-recording apparatus including: a casing section which encases a light and heat sensitive recording material; an optical recording section, downstream of the casing section, which exposes the light and heat sensitive recording material, which has been fed from the casing section, for recording a latent image; a thermal developing section, downstream of the optical recording section, which develops the latent image by heating; and an optical fixing section, downstream of the thermal developing section, which irradiates light for fixing a developed image.

In the apparatus of the present invention, a light and heat sensitive recording material is fed from the casing section to the optical recording section, in which it is exposed to light to thereby have the latent image recorded thereon. The latent image formed on the recording material is thereafter developed by heating in the thermal developing section. Then, the developed image is irradiated with light in the optical fixing section and is thus fixed on the recording material. In this manner, the latent image formed on the recording material is thermally developed, and the thus-developed image is then optically fixed thereon through irradiation with light, and the process does not require a processing solution or an image-receiving member. Accordingly, in this image-recording apparatus, images can be recorded on recording materials with a completely dry system, and no waste materials are left after the process of image formation.

In the optical recording section, a latent image can be recorded with recording light having a maximum intensity at at least one wavelength selected from a wavelength range from 300 to 1100 nm. Suitable sources of light having a wavelength shorter than 300 nm are not available, and inexpensive systems for such short wavelength light will be difficult to design. Even when sources of light having a wavelength longer than 1100 nm are used, most light and heat sensitive recording materials sensitive to such long wavelength light are unstable, and it will be difficult to design light and heat sensitive recording materials having long-term stability.

For the image-recording apparatus for color image formation, three color recording lights are preferably used, each having a maximum intensity at a wavelength individually selected from a blue wavelength range, a green wavelength range and a red wavelength range, more preferably three color recording lights each having a maximum intensity at a wavelength individually selected from: a wavelength range of from 300 to 500 nm, a wavelength range of from 450 to 700 nm, and a wavelength range of from 550 to 1100 nm.

The maximum radiation energy of the recording light on the surface of the light and heat sensitive recording material is preferably from 0.01 to 50 $mJ/cm^2$, more preferably between 0.05 and 10 $mJ/cm^2$. If the maximum radiation energy is larger than 50 $mJ/cm^2$, the system will take a long time for exposure and will therefore lose its convenience and, in addition, the light sources will be large and costs thereof will increase. On the other hand, the maximum radiation energy needs to be at least 0.01 $mJ/cm^2$, in consideration of the sensitivity of ordinary light and heat sensitive recording materials. If the maximum radiation energy is smaller than 0.01 $mJ/cm^2$, even a high-sensitivity light and heat sensitive recording material will require a light-shielding section for shielding the material from external light; and if so, the cost of the optical recording section for them will increase.

The heating temperature for thermal development is preferably from 50 to 200° C., more preferably between 90 and 140° C. If the heating temperature is lower than 50° C., the light and heat sensitive recording material will have to be developable at a temperature lower than 50° C. However, the storage stability before exposure of materials that are developable at such low temperatures is extremely poor, and stable, light and heat sensitive recording materials that can have such a low heating temperature are difficult to design. On the other hand, if the heating temperature is higher than 200° C., a support of the light and heat sensitive recording material will deform under such high-temperature heat, and dimensional stability of the material cannot be assured.

Also, preferably, temperature fluctuation from the preset heating temperature for thermal development is controlled to be within a range of ±5° C. Light and heat sensitive recording materials generally have a relatively broad latitude for temperature fluctuation in thermal development; and provided the temperature fluctuation from the preset heating temperature for thermal development of the materials is controlled to be within ±5° C., the material can be stably developed by heating.

Also, preferably, the developed materials are optically fixed with light of which the illumination falls between 10,000 and 50,000,000 lux, more preferably between 20,000 and 6,000,000 lux. If the illumination is smaller than 10,000 lux, the light will be not enough for optical fixation (optical erasure); but if larger than 50,000,000 lux, the lighting system will be large and costly, and will be inconvenient.

Another aspect of the present invention is an image-recording apparatus including: a casing section which encases a light and heat sensitive recording material; an optical recording section, downstream of the casing section, which exposes the light and heat sensitive recording material, which has been fed from the casing section, at least with a source of short wavelength light having a maximum intensity within a wavelength range of from 300 to 450 nm for recording a latent image; a thermal developing section, downstream of the optical recording section, which develops the latent image by heating; and an optical fixing section, downstream of the thermal developing section, which irradiates light for fixing a developed image.

In this apparatus of the present invention, a light and heat sensitive recording material is fed from the casing section to the optical recording section, in which it is exposed to light at least from the source of short wavelength light having the maximum intensity within a wavelength range of from 300 to 450 nm, to thereby record a latent image on the material, and the latent image is thereafter developed by heat in the thermal developing section. Next, the developed image is irradiated with light in the optical fixing section and is thus fixed on the material. In this manner, the latent image formed on the recording material is thermally developed, and the thus-developed image is then optically fixed thereon by irradiation with light, and the process does not require a processing solution and an image-receiving member. Accordingly, in the image-recording apparatus, images can be recorded on recording materials in a completely dry system, and wastes are not left after the process of image formation. In addition, in this apparatus, a source of short wavelength light having a maximum intensity within a wavelength range of from 300 to 450 nm can be used, and the recording wavelength range can be broadened. For this apparatus, therefore, it is possible to design color-photographic thermal recording materials with good color separation. Accordingly, the apparatus makes it possible to construct image-recording systems with good color reproduction.

For the image-recording apparatus for color image formation, three color recording lights can be used, a blue light having a wavelength of $\lambda_B$, a green light having a wavelength of $\lambda_G$ and a red light having a wavelength of $\lambda_R$. $\lambda_B$ falls within a wavelength range of from 300 to 450 nm, $\lambda_G$ is within a wavelength range of from 400 to 700 nm, $\lambda_R$ is within a wavelength range of from 600 to 800 nm, and $\lambda_R > \lambda_G > \lambda_B$.

The short wavelength light source in the optical recording section may be a semiconductor laser. The semiconductor laser may be a small-sized light source. In addition, the semiconductor laser used for the short wavelength light source can be directly modulated for exposing recording materials to light, and therefore no additional device for external modulation is required. Accordingly, the section for exposure may be simplified, and the apparatus can be small overall. For the short wavelength light source, a Group III element nitride semiconductor laser (e.g. GaN, InGaN, AlGaN, InGaAlN semiconductor laser) is preferable.

In the optical recording section, the recording material may be exposed to light to form a latent image thereon, with a combination of the short wavelength light source and an additional source of light, whose wavelength differs from that of the light from the short wavelength light source.

The additional light source may be selected from semiconductor lasers, solid state lasers, fiber lasers, wavelength conversion solid state lasers, and gas lasers.

The light and heat sensitive recording material to be processed in the image-recording apparatus of the present invention may contain a photo-curable composition. A recording material of this type is exposed to light that has passed through or been reflected by an image original, or is exposed to light through optical scanning of image data. Thus, the photo-curable composition in the recording material is photo-cured to form a latent image on the recording material. The recording material is then heated, and a color-forming or color-erasing component in a non-cured portion, depending on the latent image formed, moves inside the recording material to thereby form a color image. In addition, when the surface of the recording material is irradiated with light, the image formed is cured and fixed thereon, and any unnecessary coloring component is eliminated. This image-recording process is useful not only for recording black-and-white images but also for recording color images. The light and heat sensitive recording material of this type may have any of light and heat sensitive recording layers (a) to (f) mentioned below.

A light and heat sensitive recording layer (a) contains 1) thermally-responsive microcapsules which encapsulate a color-forming component A and, outside the microcapsules, 2) a photo-polymerizable composition which contains at least i) a compound B which is substantially colorless and has, within the same molecule, a polymerizable group and a site which reacts with the color-forming component A to form color, and ii) a photopolymerization initiator.

A light and heat sensitive recording layer (b) contains 1) thermally-responsive microcapsules which encapsulate a color-forming component A and, outside the microcapsules, 2) a photo-polymerizable composition which contains at least i) a substantially colorless compound C which reacts with the color-forming component A to form color, ii) a photo-polymerizable compound D and iii) a photopolymerization initiator.

A light and heat sensitive recording layer (c) contains 1) thermally-responsive microcapsules which encapsulate a color-forming component A and, outside the microcapsules, 2) a photo-polymerizable composition which contains at least i) a substantially colorless compound C which reacts with the color-forming component A to form color, ii) a photo-polymerizable compound Dp which has a site that suppresses the reaction of the color-forming component A with the compound C, and iii) a photopolymerization initiator.

A light and heat sensitive recording layer (d) contains 1) thermally-responsive microcapsules which encapsulate a substantially colorless compound C which reacts with a color-forming component A to form color and, outside the microcapsules, 2) a photo-polymerizable composition which contains at least i) the color-forming component A, ii) a photo-polymerizable compound D and iii) a photopolymerization initiator.

A photo-curable light and heat sensitive layer (e) includes an oxidant precursor E which is encapsulated in thermally-responsive microcapsules, an activator G which exists outside the thermally-responsive microcapsules and which reacts with the oxidant precursor E to generate an oxidant F, and a dye forming coupler H which couples to the oxidant F to generate a dye. By irradiation of light, an irradiated portion of the light and heat sensitive recording layer (e) is cured.

A light and heat sensitive recording layer (f) includes the oxidant precursor E outside thermally-responsive microcapsules, the activator G which is encapsulated in the thermally-responsive microcapsules and which reacts with the oxidant precursor E to generate the oxidant F, and the dye forming coupler H which couples to the oxidant F to form a dye. By irradiation of light, an irradiated portion is cured.

BRIEF DESCRIPTION OF THE DRAWINGS

FIG. 10 is a schematic view showing structural of another heating device.

FIG. 11 is a schematic view showing structural of another heating device.

FIG. 12 is a schematic view showing structural of another heating device.

DETAILED DESCRIPTION OF THE PREFERRED EMBODIMENTS

Embodiments of the present invention as applied to color image formation on a color light and heat sensitive recording material are described hereinunder with reference to the drawings attached hereto. In the color image-recording apparatus illustrated, the recording material to be processed has three monochromatic light and heat sensitive recording layers (hereinafter referred to as "recording layers") laminated on a support. In the material, each recording layer is processed to give one of the colors yellow, magenta and cyan.

First Embodiment

Figure 1:
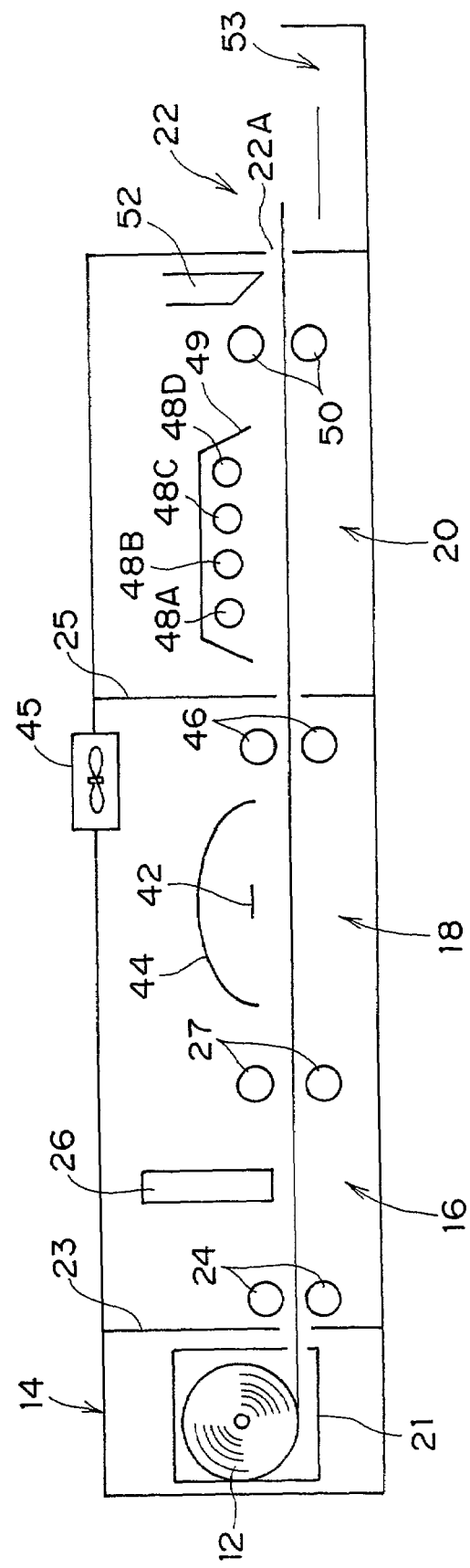
FIG. 1 is a schematic view showing an outline of one embodiment of an image-recording apparatus of the present invention.

FIG. 1 shows an outline of the constitution of an image-recording apparatus of a first embodiment of the present invention, in which the light and heat sensitive recording material 12 to be processed is wound up in a roll. As in FIG. 1, a casing section 14 in which the light and heat sensitive recording material 12 is encased; an optical recording section 16 in which the light and heat sensitive recording material 12 fed from the casing section 14 is exposed to light to record a latent image thereon; a thermal developing section 18 in which the latent image is developed under heat; an optical fixing section 20 in which the developed image is fixed through irradiation with light; and a receiver section 22 which receives the image-recorded material 12 are inside a housing of the image-recording apparatus. In the apparatus, the casing section 14, the optical recording section 16, the thermal developing section 18, the optical fixing section 20, and the receiver section 22 are disposed in that order in a horizontal direction.

Between the adjacent sections, pairs of carrier rollers 24, 27, 46 and 50 that nip the light and heat sensitive recording material 12 to carry it are disposed, and these carrier roller pairs 24, 27, 46 and 50 form a traveling route along which the light and heat sensitive recording material 12 is carried from the casing section 14 toward the receiver section 22. The carrier roller pairs 24, 27, 46 and 50 are connected with carrier driving sections (not shown), and are driven by the carrier driving sections.

The casing section 14 and the optical recording section 16 are partitioned by a wall 23 which has an opening through which the light and heat sensitive recording material 12 runs in a traveling direction thereof; and the thermal developing section 18 and the optical fixing section 20 are partitioned by a wall 25 having an opening through which the light and heat sensitive recording material 12 runs. The receiver section 22 has an outlet 22A through which the image-recorded material 12 is taken out into the receiver section 22. A cutter 52 is disposed in the optical fixing section 20 just before the outlet 22A, and cuts the light and heat sensitive recording material 12 into separate sheets, each having a recorded image region.

In the casing section 14, a magazine 21 is disposed. A roll of the light and heat sensitive recording material 12, which is wound up with its recording layer on the inside, is loaded in the magazine 21. The pair of carrier rollers 24 is disposed in the optical recording section 16, adjacent to the opening of the partition wall 23. Nipping the light and heat sensitive recording material 12 therebetween, the pair of carrier rollers 24 rotates, whereby the recording material 12 loaded in the magazine 21 in the casing section 14 is unwound and drawn out with a recording layer thereof facing upward. In this condition, the recording material 12 is carried along the predetermined traveling direction, and then reaches the optical recording section 16 which is disposed downstream in the traveling direction.

Figure 2:
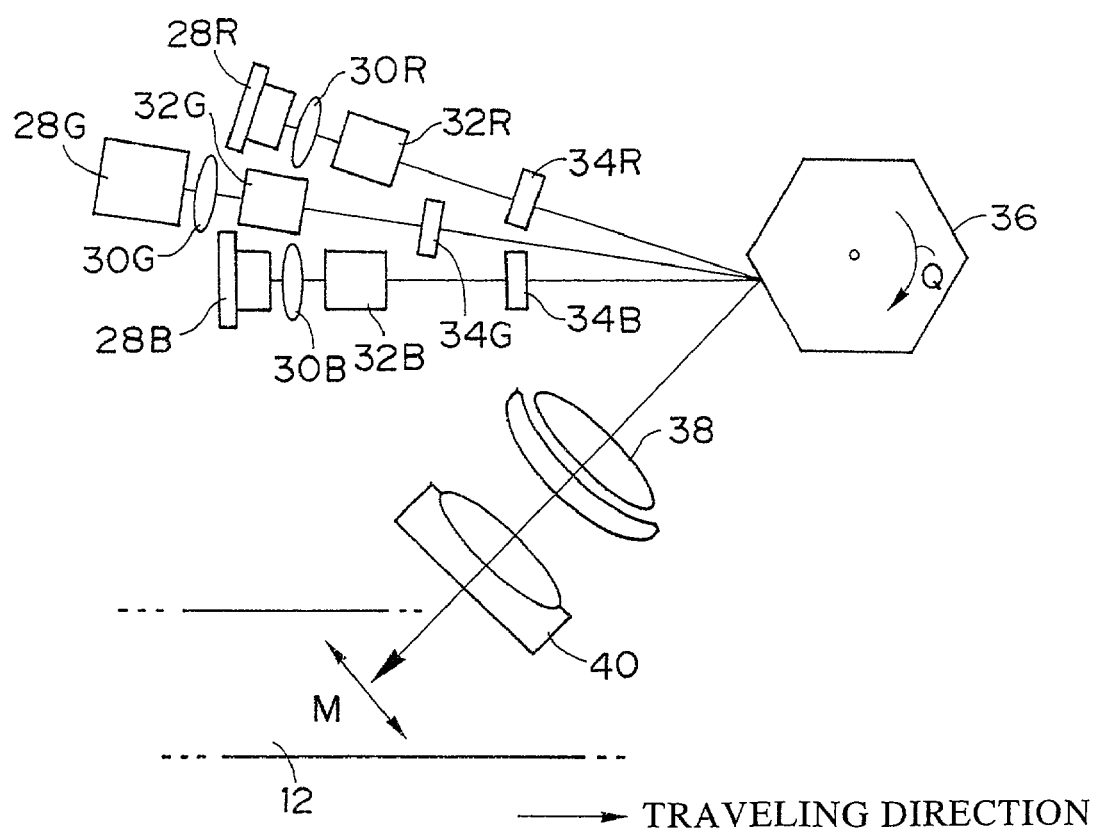
FIG. 2 is a schematic view showing an outline of a light beam scanning device for the image-recording apparatus of the embodiment of FIG. 1.

In the optical recording section 16, a light beam scanning device 26 is disposed above the recording material traveling route. As shown in FIG. 2, the light beam scanning device 26 is equipped with three color laser sources, a red laser source 28R, a green laser source 28G and a blue laser source 28B. These laser sources are equipped with photo-modulators 32R, 32G and 32B, respectively (these comprise collimator lenses 30R, 30G and 30B, respectively, and acoustic optical modulators (AOM)), and with cylindrical lenses 34R, 34G and 34B, respectively. The photo-modulators 32R, 32G and 32B are driven by separate modulator driving sections (not shown). A polygonal mirror 36, an fθ lens 38, and a cylindrical lens 40 are disposed at a light-emitting side of the cylindrical lenses 34R, 34G and 34B.

The laser sources 28R, 28G and 28B are not specifically defined. For these, besides ordinary semiconductor lasers, solid state lasers, fiber lasers, wavelength conversion solid state lasers, gas lasers, vertical-cavity surface-emitting lasers and the like are usable herein. Semiconductor lasers can be directly modulated without any need for an external modulator such as an AOM, as will be described later. Therefore, in order to reduce the size of the apparatus, semiconductor lasers are preferred.

The laser sources 28R, 28G and 28B may have a maximum intensity within a wavelength range of from 300 to 1100 nm. Suitable sources of light having a wavelength shorter than 300 nm are not available, and inexpensive systems for such short wavelength light are difficult to design. Even when sources of light having a wavelength longer than 1100 nm are used, most light and heat sensitive recording materials sensitive to such long wavelength light are unstable, and it is difficult to design light and heat sensitive recording materials having long-term stability. Specifically, the laser sources 28B, 28G and 28R may have maximum intensities at wavelengths selected from a wavelength range of from 300 to 500 nm, a wavelength range of from 450 to 700 nm and a wavelength range of from 550 to 1100 nm, respectively. In this embodiment, for example, the red laser source 28R may be a semiconductor laser having a central oscillation wavelength of 680 nm; the green laser source 28G may be a semiconductor laser-excited wavelength conversion solid state laser having a central oscillation wavelength of 532 nm; and the blue laser source 28B may be a semiconductor laser-excited wavelength conversion solid state laser having a central oscillation wavelength of 473 nm.

To design color photographic materials of good color separation with ease, and without problems of color mixing, the laser source 28B for the shortest wavelength is preferably a semiconductor laser having a maximum intensity within a wavelength range of from 300 to 450 nm, and more preferably a Group III element nitride (such as GaN, InGaN, AlGaN, InGaAlN) semiconductor laser.

In this case, for example, the red laser source 28R may be a semiconductor laser having a central oscillation wavelength of 680 nm; the green laser source 28G may be a semiconductor laser-excited wavelength conversion solid state laser having a central oscillation wavelength of 532 nm; and the blue laser source 28B may be a semiconductor laser having a central oscillation wavelength of 410 nm.

Preferably, the maximum radiation energy of a recording light on the surface of the light and heat sensitive recording material 12 is between 0.01 and 50 mJ/cm$^2$, and more preferably between 0.05 and 10 mJ/cm$^2$. If the maximum radiation energy is larger than 50 mJ/cm$^2$ the system will take a long time for exposure and will therefore lose its convenience. In addition, the light sources will be large and their costs will therefore increase. On the other hand, the maximum radiation energy will have to be at least 0.01 mJ/cm$^2$, in consideration of the general sensitivity of the light and heat sensitive recording material 12. If the maximum radiation energy is smaller than 0.01 mJ/cm$^2$, even high-sensitivity light and heat sensitive recording materials will require a light-shielding section for shielding from external light. In this case, the cost of the optical recording section will increase.

The laser rays emitted by the laser sources 28R, 28G and 28B are made to run parallel with each other, having passed through the collimator lenses 30R, 30G and 30B, respectively, and then reach the photo-modulators 32R, 32G and 32B, respectively. Modulation signals are inputted into the photo-modulators 32R, 32G and 32B from modulator driving sections (not shown), and the intensity of each laser ray having entered the photo-modulators is individually modulated according to a modulation signal inputted into the photo-modulator. The laser rays whose intensities have been thus modulated by the photo-modulators 32R, 32G and 32B then reach the cylindrical lenses 34R, 34G and 34B, respectively, through which the laser rays are focused onto a surface of the polygonal mirror 36. The thus-focused laser rays are reflected from the surface of the polygonal mirror 36, corrected by the fθ lens 38 and the cylindrical lens 40, and thereafter dot-wise converged onto the light and heat sensitive recording material 12. The polygonal mirror 36 is rotationally driven by a polygonal mirror driving section (not shown), and is rotated in the direction of arrow Q at a predetermined angular speed. Accordingly, the light and heat sensitive recording material 12 is main-scanned in the direction of arrow M by the laser rays reflected on the polygonal mirror 36.

The pair of carrier rollers 27 is disposed downstream in the traveling direction from the optical recording section 16. The light and heat sensitive recording material 12 is nipped by the pair of carrier rollers 27 and conveyed along the traveling route, and reaches the thermal developing section 18 which is disposed further downstream in the traveling direction. As mentioned hereinabove, the light and heat sensitive recording material 12 is main-scanned by the laser rays reflecting from the surface of the polygonal mirror 36, while being sub-scanned in a direction opposite to the traveling direction. The light and heat sensitive recording material 12 is thus exposed to light, to have a latent image recorded thereon.

The polygonal mirror-driving section, the carrier-driving sections and the modulator-driving sections are all controlled synchronously with exposure of the light and heat sensitive recording material 12 by an exposure controller (not shown) that reads analyzed image data from a frame memory of an image analyzer (not shown) and controls the exposure of the light and heat sensitive recording material 12 on the basis of the analyzed image data.

The thermal developing section 18 is equipped with a far-infrared heater 42, which is disposed above the traveling route and serves as a heating device for heating the exposed surface of the light and heat sensitive recording material 12, and a reflector 44, which is disposed behind the far-infrared heater 42 and acts to reflect far-infrared rays from the heater 42 toward the light and heat sensitive recording material 12. The far-infrared heater 42 is controlled by a temperature controller (not shown) such that it can heat the light and heat sensitive recording material 12 up to a predetermined temperature, based on data from a temperature sensor (not shown) which is disposed near the light and heat sensitive recording material 12. In the thermal developing section 18, the light and heat sensitive recording material 12 is heated by the far-infrared heater 42 up to the predetermined temperature, and the latent image recorded on the recording material 12 is developed.

The heating temperature is at least a developing temperature of the light and heat sensitive recording material 12, and is preferably between 50 and 200° C., and more preferably between 90 and 140° C. If the heating temperature is lower than 50° C., the light and heat sensitive recording materials must be developable at the temperature lower than 50° C. However, storage stability before exposure to light of materials developable at such low temperatures is extremely poor, and stable light and heat sensitive recording materials that can accept such a low heating temperature are difficult to design. On the other hand, if the heating temperature is higher than 200° C., the support of the light and heat sensitive recording material 12 may deform under such high-temperature heating, and dimensional stability of the material cannot be ensured. Temperature fluctuations from the preset heating temperature are controlled to stay within a range of ±5° C. Light and heat sensitive recording materials generally have a relatively broad latitude for temperature fluctuation in thermal development, and can well ensure their properties given temperature fluctuations in thermal development that are within a range of ±5° C.

Above the far infrared heater 42 and downstream in the traveling direction, an exhaust section 45 is disposed via which vapor, such as moisture that has been generated in the process of thermal development, is removed from the system. Specifically, the exhaust section 45 sucks up the vapor that has been generated in the process of thermal development, and a gas adsorptive filter provided at the exhaust section 45 adsorbs the vapor. In this manner, the vapor is removed from the system.

The pair of carrier rollers 46 are disposed downstream in the traveling direction from the thermal developing section 18. After development in the developing section 18, the light and heat sensitive recording material 12 is nipped by the pair of carrier rollers 46 and conveyed along the traveling route, and reaches the optical fixing section 20 which is disposed further downstream in the traveling direction.

The optical fixing section 20 is equipped with fixing light sources 48A, 48B, 48C and 48D, which emit light toward the image-forming surface of the developed light and heat sensitive recording material 12, and with a reflector 49, which is disposed behind the fixing light sources 48A, 48B, 48C and 48D. Here, the fixing light sources 48A, 48B, 48C and 48D are all disposed above the traveling route. In the optical fixing section 20, the developed light and heat sensitive recording material 12 is irradiated with light from the fixing light sources 48A, 48B, 48C and 48D, and the developed image is thus fixed on the light and heat sensitive recording material 12.

White light sources such as fluorescent lamps can be used for the fixing light sources 48, and also any other of various light sources such as LEDs, halogen lamps, cold cathode ray tubes, lasers, etc. The illumination of the light to be applied to the developed light and heat sensitive recording material 12 must be enough for optical fixing of the developed image, and is basically determined depending on the properties of the light and heat sensitive recording material 12. Preferably, the illumination is between 10,000 and 50,000,000 lux, and more preferably between 20,000 and 6,000,000 lux. If the illumination is smaller than 10,000 lux, the light will be not enough for optical fixing (optical erasure); and if larger than 50,000,000 lux, the lighting system will be large and costly, and will be inconvenient.

The pair of carrier rollers 50 is disposed downstream in the traveling direction from the optical fixing section 20. After being optically fixed in the optical fixing section 20, the image-recorded material 12 is nipped by the pair of carrier rollers 50 and conveyed along the traveling route toward the receiver section 22 which is disposed further downstream in the traveling direction.

A print tray 53 is provided adjacent to the outlet 22A of the receiver section 22. The long, unwound light and heat sensitive recording material 12, after having been continuously processed for exposure, development and fixing as described above, is cut into sheet prints with the cutter 52, which is provided in the optical fixing section 20, just before the outlet 22A. The sheet prints having passed through the outlet 22A are fed out to the print tray 53.

With this apparatus, all the steps for optical recording, thermal development and optical fixing of a light and heat sensitive recording material can be carried out in one apparatus. Specifically, in this apparatus, since the latent image formed on the recording material is thermally developed and the developed image thereon is optically fixed, no processing solution is needed. Therefore, this apparatus may be a completely dry system, and does not produce waste materials, because image-receiving members and the like are not needed.

In cases where a short wavelength light source having a maximum intensity in a wavelength range of from 300 to 450 nm is used in the optical recording section, color light and heat sensitive recording materials with good color separation can be designed, and the apparatus makes it possible to form an image-recording system with good color reproduction.

In a case where semiconductor lasers are used for the red laser source and the blue laser source, the exposure system may be further reduced in size than in a case where solid state lasers are used therefor.

Second Embodiment

Figure 3:
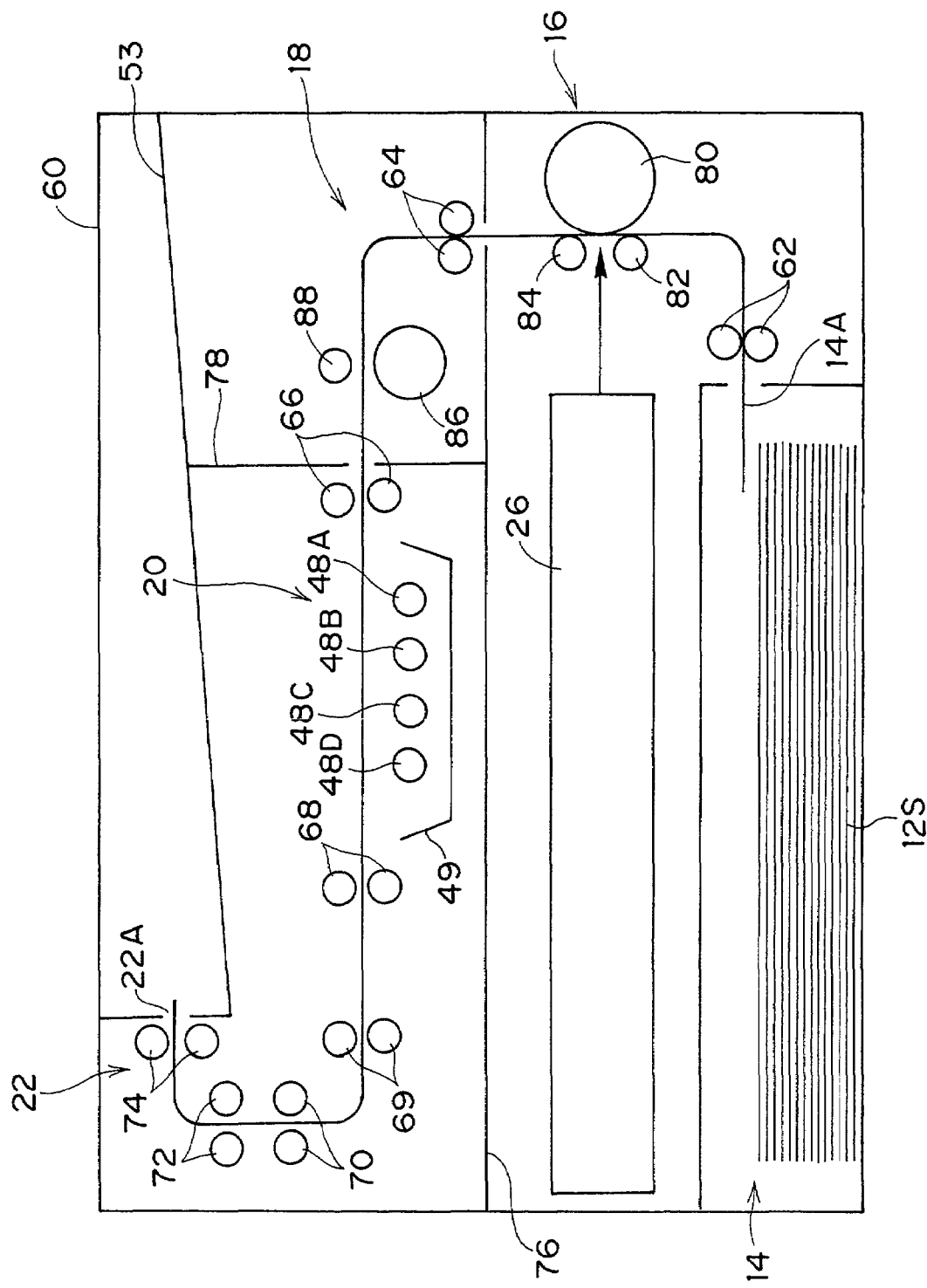
FIG. 3 is a schematic view showing an outline of another embodiment of the image-recording apparatus of the present invention.

FIG. 3 shows an outline of the structure of an image-recording apparatus of a second embodiment of the present invention, in which light and heat sensitive recording sheets 12S are processed. As shown in FIG. 3, inside a housing of the image-recording apparatus are: the cassette-type casing section 14 in which the light and heat sensitive recording sheets 12S are encased; the optical recording section 16 in which the recording sheets 12S, which are fed one by one from the casing section 14, are exposed to light to record a latent image thereon; the thermal developing section 18 in which the latent image is developed by heating; the optical fixing section 20 in which the developed image is fixed through irradiation with light; and the receiver section 22 which receives the recording sheets 12S. In this apparatus, the optical recording section 16 is above the casing section 14; the thermal developing section 18 and the optical fixing section 20 are above the optical recording section 16; and the receiver section 22 is above the optical fixing section 20.

Pairs of carrier rollers 62, 64, 66, 68, 69, 70, 72 and 74 are disposed between the adjacent sections. These carrier roller pairs 62, 64, 66, 68, 69, 70, 72 and 74 form a curved traveling route along which the light and heat sensitive recording sheets 12S are conveyed from the casing section 14 to the receiver section 22. These carrier roller pairs 62, 64, 66, 68, 69, 70, 72 and 74 are connected with carrier driving sections (not shown), and are driven by the carrier driving sections.

The casing section 14 and the optical recording section 16 are spaced from the other sections by a partition wall 76 that has an opening through which the light and heat sensitive recording sheets 12S run along a traveling direction. The thermal developing section 18 and the optical fixing section 20 are partitioned by a partition wall 78 that has an opening through which the light and heat sensitive recording sheets 12S run. The receiver section 22 has the outlet 22A through which the image-recorded sheets 12S are ejected.

In the cassette-type casing section 14, a number of the light and heat sensitive recording sheets 12S are stacked with their recording layers facing upward. The casing section 14 has an outlet 14A, through which the light and heat sensitive recording sheets 12S are one by one guided into an optical recording zone. The pair of carrier rollers 62 is disposed in the optical recording section 16, adjacent to the outlet 14A. Nipping one light and heat sensitive recording sheet 12S therebetween, the pair of carrier rollers 62 rotates, and the one light and heat sensitive recording material 12S loaded in the casing section 14 is drawn out into the optical recording zone. Having been drawn out of the casing section 14, the light and heat sensitive recording sheet 12S is conveyed in the traveling direction, is turned upward by about 90 degrees, and reaches the optical recording section 16 which is disposed downstream in the traveling direction.

The optical recording section 16 has the light beam scanning device 26, an exposure drum 80 and nip rollers 82 and 84, which are disposed to be detachable from the exposure drum 80, disposed along the sheet traveling direction and above the casing section 14. The nip rollers 82 and 84 are positioned upstream and downstream from an exposure site of the light beam scanning device 26 in such a manner as to sandwich the exposure site therebetween. The light beam scanning device 26 is the same as in the first embodiment, and is therefore indicated by the same reference numeral in the two embodiments. Further description thereof is omitted.

One light and heat sensitive recording sheet 12S is held at the exposure site by the nip rollers 82 and 84 and by the exposure drum 80, and is main-scanned by the light beam scanning device 26. While being scanned in this manner, the light and heat sensitive recording material 12S is conveyed along the traveling direction by the nip rollers 82 and 84 and by the exposure drum 80, and is sub-scanned in the direction opposite to the traveling direction. In this manner, the light and heat sensitive recording material 12S is exposed to light on its recording layer, and a latent image is thereby recorded.

Preferably, the wavelengths of the light sources for exposure, and the maximum radiation energy on the surface of the light and heat sensitive recording sheet 12S are within the same ranges as in the first embodiment.

The pair of carrier rollers 64 is disposed downstream in the traveling direction from the optical recording section 16. The light and heat sensitive recording material 12S is nipped by the pair of carrier rollers 64 and conveyed along the traveling route, while being turned about 90 degrees toward the left (of the drawing), and reaches the thermal developing section 18 which is disposed further downstream in the traveling direction.

The thermal developing section 18 is equipped with a drum heater 86, which is disposed below the traveling route and serves as a heating device for heating the exposed surface of the light and heat sensitive recording sheet 12S, and a pressure roller 88 disposed opposite the drum heater 86 such that the light and heat sensitive recording sheet 12S passes through a space between the roller 88 and the drum 86. The drum heater 86 has a heat source such as a halogen lamp or the like thereinside. The drum heater 86 is controlled by a temperature controller (not shown) so as to heat the light and heat sensitive recording material 12S up to a predetermined temperature on the basis of data from a temperature sensor (not shown) disposed near the light and heat sensitive recording material 12S. In the thermal developing section 18, the light and heat sensitive recording material 12S is heated by the drum heater 86 up to the predetermined temperature, and the recorded latent image is developed. Preferably, the heating temperature is within the same range as in the first embodiment.

The pair of carrier rollers 66 is disposed downstream in the traveling direction from the thermal developing section 18. After having been developed in the thermal developing section 18, the light and heat sensitive recording sheet 12S is nipped by the pair of carrier rollers 66 and conveyed in a leftward direction (of the drawing) along the traveling route, and reaches the optical fixing section 20 which is disposed further downstream in the traveling direction.

The optical fixing section 20 is equipped with the fixing light sources 48A, 48B, 48C and 48D that emit light toward the image-forming surface of the developed light and heat sensitive recording sheet 12S, and with the reflector 49 that is disposed behind the fixing light sources 48A, 48B, 48C and 48D. Here, the fixing light sources 48A, 48B, 48C and 48D are all disposed below the traveling route. In the optical fixing section 20, the developed light and heat sensitive recording sheet 12S is irradiated with light from the fixing light sources 48A, 48B, 48C and 48D, and the developed image is thus fixed on the light and heat sensitive recording sheet 12S. Including illumination, the details of the fixing sources 48 may be the same as in the first embodiment.

The pairs of carrier rollers 68, 69, 70, 72 and 74 are disposed downstream in the traveling direction from the optical fixing section 20. After optically fixing in the optical fixing section 20, the light and heat sensitive recording material 12S is nipped by the pairs of carrier rollers 68, 69, 70, 72 and 74, turned upward about 90 degrees between the carrier roller pairs 69 and 70, and rightward about 90 degrees between the carrier roller pairs 72 and 74, and conveyed along the traveling route toward the receiver section 22 which is disposed further downstream in the traveling direction.

A print tray 53 is provided adjacent to the outlet 22A of the receiver section 22. After having been continuously processed for exposure, development and fixation as described above, the light and heat sensitive recording sheet 12S is fed out to the print tray 53.

In the second embodiment, all the steps of optical recording, thermal development and optical fixation of light and heat sensitive recording sheets can be carried out in one apparatus. Specifically, in this apparatus, since the latent image formed on each recording sheet is thermally developed and the developed image thereon is optically fixed, no processing solution is needed. Therefore, this apparatus may be a completely dry system, and, because of not requiring an image-receiving member and the like, does not leave waste.

In addition, because the casing section, the optical recording section, the thermal developing section and the optical fixing section are vertically arranged in the apparatus, and the sheet traveling route is curved between the sections therein, it is possible to further reduce the size of the apparatus.

In the first and second embodiments, a light beam scanning device equipped with laser sources is used in the optical recording section. Rather than this, lamps and LEDs could also be used, with the light therefrom being appropriately focused. The recording material may in certain cases be exposed to light via images projected with a lamp or the like. If desired, contact exposure is employable in the apparatus of the present invention.

In cases where a short wavelength light source having a maximum intensity in the wavelength range from 300 to 450 nm is used in the optical recording section, color light and heat sensitive recording materials with good color separation can be designed, and the apparatus makes it possible to form an image-recording systems with good color reproduction.

In cases where semiconductor lasers are used for the red laser source and the blue laser source, it will be possible to further reduce the size of the apparatus. In cases where the laser sources in the optical recording section are all semiconductor lasers, each semiconductor laser can be directly modulated. In such a case, the exposure system can be further simplified, and the overall size of the apparatus can be further reduced.

In the first and second embodiments, a semiconductor laser having a central oscillation wavelength of 680 nm is used for the red laser source, a semiconductor laser-excited wavelength conversion solid state laser having a central oscillation wavelength of 532 nm is used for the green laser source, and a semiconductor laser-excited wavelength conversion solid state laser having a central oscillation avelength of 473 nm is used for the blue laser source. Alternatively, a semiconductor laser having a central oscillation wavelength of 680 nm is used for the red laser source, a semiconductor laser-excited wavelength conversion solid state laser having a central oscillation wavelength of 532 nm is used for the green laser source, and a semiconductor laser having a central oscillation wavelength of 410 nm is used for the blue laser source. Apart from these combinations of laser sources, also preferable is a combination of a semiconductor laser having a central oscillation wavelength of 660 nm, for the red laser source, a semiconductor laser-excited wavelength conversion solid state laser having a central oscillation wavelength of 532 nm, for the green laser source, and a semiconductor laser having a central oscillation wavelength of 405 nm for the blue laser source. Naturally, any other combinations can be used.

For the laser sources, any of gas lasers such as He—Ne lasers, argon lasers, carbon dioxide lasers, excimer lasers, etc.; solid state lasers such as ruby lasers, Pr-YLF lasers, Nd-YAG lasers, Nd-glass lasers, Q switch lasers, etc.; semiconductor lasers such as edge-emitting semiconductor lasers, vertical cavity surface-emitting semiconductor lasers, etc.; and liquid lasers such as dye lasers, etc. can be used. Also usable are fiber lasers that contain an oscillating substance in an optical fiber.

One example of a solid state laser is a semiconductor-excited solid state lasers, in which is a solid state laser crystal doped with $Pr^{3+}$ (praseodymium) alone or co-doped with $Pr^{3+}$ along with any other rare earth element ($Er^{3+}$ (erbium), $Dy^{3+}$ (dysprosium), $Ho^{3+}$ (holmium), $Eu^{3+}$ (europium), $Sm^{3+}$ (samarium), or $Nd^{3+}$ (neodymium)) is used. The doped solid state laser crystal serves as a laser medium, and this is excited with a Group III element nitride semiconductor laser. Semiconductor lasers for blue laser sources and green laser sources include, for example, GaN or AlGaInP vertical-cavity surface-emitting lasers. For blue laser sources, especially used are Group III element nitride semiconductor lasers.

In cases where solid state lasers and semiconductor lasers are not suitable as the red laser source, green laser source and blue laser source, due to not producing laser rays within a desired wavelength range, a solid state laser or semiconductor laser may be combined with a wavelength conversion element to form a wavelength conversion solid or semiconductor laser devices.

One example of a wavelength conversion solid state laser devices constructed by combining a solid state laser with a wavelength conversion element is a second harmonic generation device, which is as follows: A solid state laser crystal serving as a laser medium is excited by a GaAs semiconductor laser, and laser beams emitted by the solid state laser crystal are wave-changed into second harmonics by a waveguide-type second harmonic generation (SHG) element having a periodic domain-inverting structure.

One example of a wavelength conversion semiconductor laser device constructed by combining a semiconductor laser and a wavelength conversion element is a second harmonic generation device. This comprises a semiconductor laser and a waveguide-type SHG element bonded to the semiconductor laser. In this device, the waveguide-type SHG element is produced by forming a periodic domain-inverting structure in a ferroelectric crystal substrate that has a non-linear optical effect. The laser beams emitted by the semiconductor laser in this device are wave-changed into second harmonics by the SHG element.

In the first and second embodiments, a polygonal mirror is used as the essential scanning device in the optical recording section. Besides this, galvanometer mirrors may also be used. Further, two galvanometer mirrors may be combined for two-dimensional scanning.

In the first and second embodiments, a fixing light source is disposed separately from the recording light source in the optical recording section. Rather than this, a light beam scanning device equipped with a laser light source and used in the optical recording section could also be used in the optical fixing section, with the developed image being optically fixed by scanning exposure with light from the light beam scanning device, having the same wavelength as the recording light.

In the first embodiment, the heating device used is a far-infrared heater, and in the second embodiment, the heating device used is a drum heater combined with a pressure roller. Besides these, any other of various heating devices, as shown in FIGS. 4 to 12, are also usable in the apparatus of the present invention. In the first and second embodiments, the light and heat sensitive recording material is heated from the exposed surface side. Rather than this, the light and heat sensitive recording material could be heated from the support side.

Figure 4:
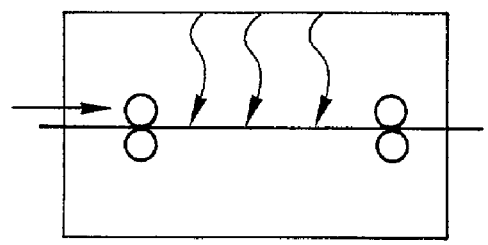
FIG. 4 is a schematic view showing an outline of another embodiment of a heating device for the image-recording apparatus of the present invention.
Figure 5:
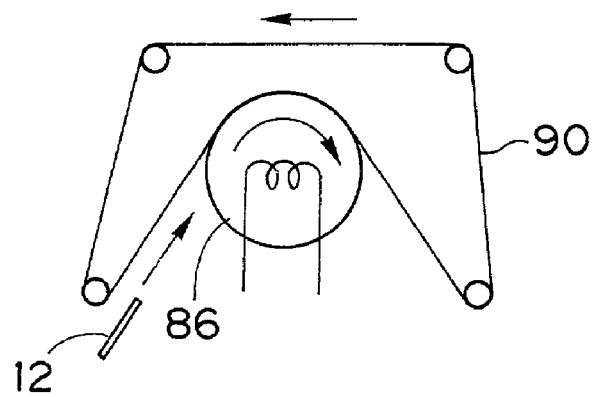
FIG. 5 is a schematic view showing structural of another heating device.
Figure 6:
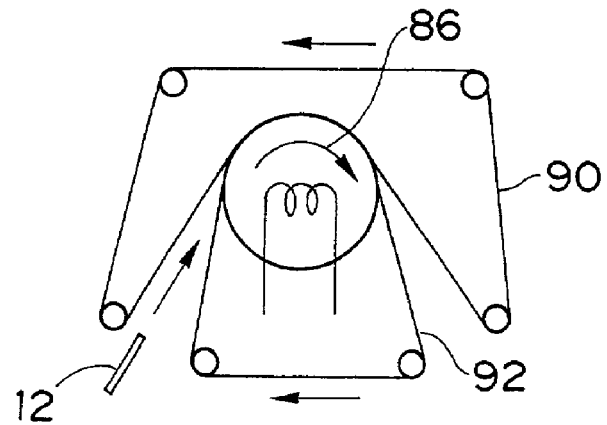
FIG. 6 is a schematic view showing structural of another heating device.

The heating device shown in FIG. 4 is for thermal development with hot air streams. In the heating device of FIG. 5, a pressure belt 90, which serves as a pressure member, is used. Here, the pressure belt 90 presses the light and heat sensitive recording material 12 against the drum heater 86 and the latent image formed on the light and heat sensitive recording material 12 is developed by heat. In the heating device shown in FIG. 6, a belt 92 is disposed to run under tension around the drum heater 86, which has a heat source inside, and the light and heat sensitive recording material 12 is pressed against the belt 92 by the pressure belt 90, and heated for thermal development.

Figure 7:
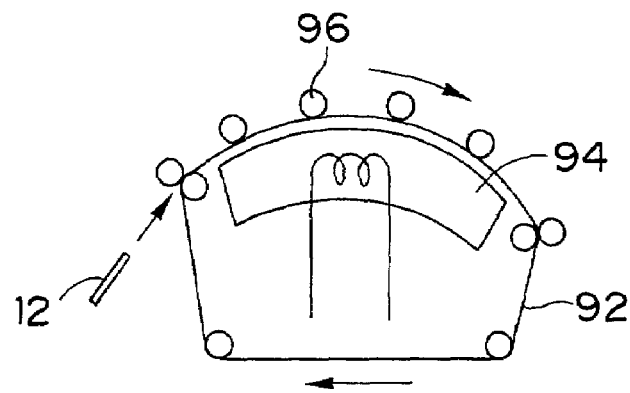
FIG. 7 is a schematic view showing structural of another heating device.
Figure 8:
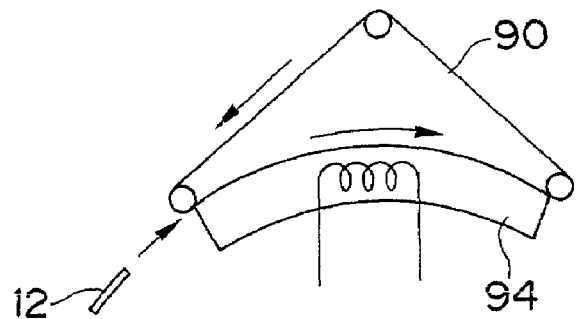
FIG. 8 is a schematic view showing structural of another heating device.

In the heating device shown in FIG. 7, the belt 92 is disposed to run under tension around a convex plate heater 94, the light and heat sensitive recording material 12 is pressed by a plurality of pressure rollers 96 against the belt 92, and is heated for thermal development. In the heating device shown in FIG. 8, the pressure belt 90 that serves as a pressure member is used. Here, the pressure belt 90 presses the light and heat sensitive recording material 12 against the convex plate heater 94, and the latent image formed on the light and heat sensitive recording material 12 is developed by heating.

Figure 9:
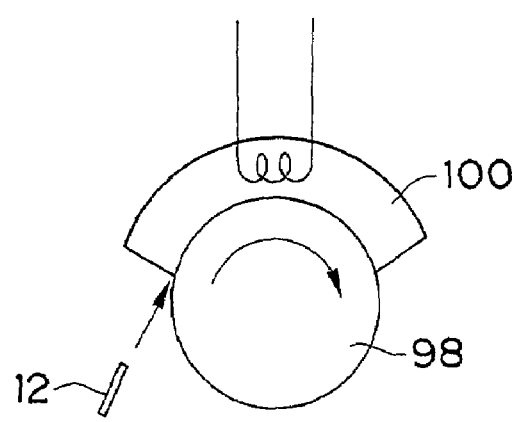
FIG. 9 is a schematic view showing structural of another heating device.

In the heating device shown in FIG. 9, a concave plate heater 100 is disposed along the periphery of a drum 98, the drum 98 presses the light and heat sensitive recording material 12 against the concave plate heater 100, and the latent image formed on the light and heat sensitive recording material 12 is developed by heat. In the heating device shown in FIG. 10, a plurality of pressure rollers 102, which all serve as a pressure member, are disposed along the inner periphery of the concave plate heater 100, the light and heat sensitive recording material 12 is pressed against the concave plate heater 100 by the pressure rollers 102, and is heated for thermal development.

In the heating device shown in FIG. 11, a plurality of pairs of heating rollers 104, each and all having a heat source thereinside, are disposed along the traveling route, and the light and heat sensitive recording material 12, while being nipped by the heating roller pairs 104, is heated thereby for thermal development. In the heating device shown in FIG. 12, heating rollers 106 are electrically heated by an external power source that is directly connected thereto, and a plurality of roller pairs, each of one of the heating rollers 106 and one of pressure rollers 108, is disposed along the traveling route. Here, the light and heat sensitive recording material 12 is heated by the roller pairs while being nipped thereby, and is thus thermally developed.

Next, a light and heat sensitive recording material, which is used for image-recording in the image-recording device of the present invention, will be described. The light and heat sensitive recording material used in the present invention has a light and heat sensitive layer (an image-recording layer) on a support. At this light and heat sensitive layer, a latent image is formed by exposure. The latent image is developed by being heated, so that an image is formed. In the light and heat sensitive recording material used in the present invention, other than the light and heat sensitive recording layer, conventionally known other layers such as a protection layer, an intermediate layer, a UV absorbing layer and the like may be formed at any position. The light and heat sensitive recording material used in the present invention has, on the support, at least three light and heat sensitive recording layers, which include a yellow color-forming component, a magenta color-forming component and a cyan color-forming component, respectively. Thus, the material can be used for color image formation as a color light and heat sensitive recording material. This color light and heat sensitive recording material may include a light and heat sensitive recording layer that includes a black color-forming component, if required.

In the present invention, a light and heat sensitive recording material which includes a light and heat sensitive recording layer (a), (b), (c) or (d) can be appropriately used. These light and heat sensitive recording layers (a), (b), (c) and (d) are as follows.

A light and heat sensitive recording layer (a) contains 1) thermally-responsive microcapsules which encapsulate a color-forming component A and, outside the microcapsules, 2) a photo-polymerizable composition which contains at least i) a compound B which is substantially colorless and has, within the same molecule, a polymerizable group and a site which reacts with the color-forming component A to form color, and ii) a photopolymerization initiator.

A light and heat sensitive recording layer (b) contains 1) thermally-responsive microcapsules which encapsulate a color-forming component A and, outside the microcapsules, 2) a photo-polymerizable composition which contains at least i) a substantially colorless compound C which reacts with the color-forming component A to form color, ii) a photo-polymerizable compound D and iii) a photopolymerization initiator.

A light and heat sensitive recording layer (c) contains 1) thermally-responsive microcapsules which encapsulate a color-forming component A and, outside the microcapsules, 2) a photo-polymerizable composition which includes at least i) a substantially colorless compound C which reacts with the color-forming component A to form color, ii) a photo-polymerizable compound Dp which has a site that suppresses the reaction of the color-forming component A with the compound C, and iii) a photopolymerization initiator.

A light and heat sensitive recording layer (d) contains 1) thermally-responsive microcapsules which encapsulate a substantially colorless compound C which reacts with a color-forming component A to form color and, outside the microcapsules, 2) a photo-polymerizable composition which contains at least i) the color-forming component A, ii) a photo-polymerizable compound D and iii) a photopolymerization initiator.

In the light and heat sensitive recording layer (a), by carrying out exposure of a desired image shape, the photo-polymerizable composition outside the microcapsules polymerizes and is cured by radicals generated from the photopolymerization initiator so that a latent image of the desired image shape is formed. Then, due to heating, the compound B present in an unexposed portion moves within the recording material, and reacts with the color-forming component A within the capsules, thereby forming color. Accordingly, the above-described light and heat sensitive recording layer (a) is a positive light and heat sensitive recording layer in which colors are not formed at an exposed portion, and uncured portions in the unexposed portion form color so that an image is formed. Specific examples thereof include a light and heat sensitive recording layer disclosed in Japanese Patent Application Laid-Open (JP-A) No. 3-87827, which contains, outside microcapsules, a photo-curable composition that contains a compound having, within the same molecule, an electron accepting group and a polymerizable group and that has a photopolymerization initiator, and which includes an electron donating colorless dye which is encapsulated in the microcapsules. In this light and heat sensitive recording layer, by carrying out exposure, the photo-curable composition present outside the microcapsules polymerizes and is cured so that a latent image is formed. Thereafter, due to heating, the electron accepting compound present in unexposed portions moves within the recording material and reacts with the electron donating colorless dye within the microcapsules so as to form color. Accordingly, the cured latent image portions in the exposed portions do not form color and only the uncured portions form color, so that a sharp positive image having high contrast can be formed.

In the above-described light and heat sensitive recording layer (b), by effecting exposure to the desired image shape, the photo-polymerizable compound D is polymerized by radicals generated from the photopolymerization initiator, which begins a reaction when exposed, and the film is cured so that a latent image of the desired image shape is formed. Because the photo-polymerizable compound D does not have a site for suppressing the reaction of the color-forming component A with the compound C, the compound C present in the unexposed portion moves within the recording material due to heating, and reacts with the color-forming component A within the capsules so as to form color. Thus, the above-described light and heat sensitive recording layer (b)

is a positive light and heat sensitive recording layer in which color is not formed at the exposed portions and color is formed at the uncured portions in the unexposed portion, so that an image is formed. Specific examples of such a light and heat sensitive recording layer include a light and heat sensitive recording layer which contains an azomethine dye precursor encapsulated in microcapsules, a deprotective agent which generates an azomethine dye from the dye precursor, a photo-polymerizable compound and a photopolymerization initiator. In this light and heat sensitive recording layer, by effecting exposure, the photo-polymerizable compound outside the microcapsules is polymerized and cured, and a latent image is formed. Then, the deprotective agent present in the unexposed portion is moved within the recording material by heating, and reacts with the azomethine dye precursor within the microcapsules so as to form color. Accordingly, the cured latent image portion of the exposed portion does not form color and only the uncured portions form color, so that a positive image can be formed.

In the light and heat sensitive recording layer (c), by carrying out exposure to the desired image shape, the photo-polymerizable compound Dp is polymerized by radicals generated from the photopolymerization initiator, which begins a reaction when exposed, and the film is cured so that a latent image of the desired image shape is formed. Since the photo-polymerizable compound Dp has a site for suppressing the reaction of the color-forming component A with the compound C, the compound C moves depending on the film characteristic of the latent image (the cured portion) formed by exposure, and reacts with the color-forming component A in the capsules to form the image. Thus, the above-described light and heat sensitive recording layer (c) is a negative light and heat sensitive recording layer, in which the exposed portion forms color so that an image is formed. Specific examples of such a light and heat sensitive recording layer include a light and heat sensitive recording layer disclosed in JP-A No. 4-211252 which contains, outside microcapsules, an electron accepting compound, a polymerizable vinyl monomer and a photopolymerization initiator and, encapsulated in the microcapsules, an electron donating colorless dye. The mechanism for image formation in this light and heat sensitive recording layer is unclear but is thought to be as follows. The vinyl monomer which exists outside the microcapsules is polymerized by exposure. Meanwhile, the electron accepting compound present at the exposed portion is not included in the formed polymer at all. Instead, the interaction of the electron accepting compound with the vinyl monomer decreases, so that the electron accepting compound exists in a movable state with high diffusion speed. The electron accepting compound in the unexposed portion is trapped by the vinyl monomer in the unexposed portion. Thus, under heating, the electron accepting compound in the exposed portion moves preferentially within the recording material, and reacts with the electron donating colorless dye within the microcapsules. The electron accepting compound in the unexposed portion cannot penetrate the capsule walls, even when heated, and does not react with the electron donating colorless dye, so cannot contribute to color formation. Accordingly, in the light and heat sensitive recording layer, since the image is formed such that the exposed portion thereof forms color and the unexposed portion thereof does not form color, a sharp negative image with high contrast can be formed.

In the above-described light and heat sensitive recording layer (d), by carrying out exposure to the desired image shape, the photo-polymerizable compound D is polymerized by radicals generated from the photopolymerization initiator, which begins reaction due to exposure, and the film is cured, so that a latent image of the desired image shape is formed. Since the photo-polymerizable compound D does not have a site for suppressing the reaction of the color-forming component A with the compound C, the color-forming component A present at the unexposed portion moves within the recording material when heated, and reacts with the compound C within the capsules so as to form color. Accordingly, the above-described light and heat sensitive recording layer (d) is a positive light and heat sensitive recording layer in which color is not formed at the exposed portion and color is formed at the uncured portions of the unexposed portion, so that an image is formed.

Components which form the above-described light and heat sensitive recording layers (a) through (d) will be described in detail hereinafter. As the color-forming component A in the light and heat sensitive recording layers (a) through (d), a substantially colorless electron donating colorless dye or a diazonium salt compound may be used.

Conventionally known electron donating colorless dyes may be used, and any dye may be used provided it reacts with the compound B or the compound C to form color. Specific examples of these color-forming components include the compounds disclosed in Japanese Patent Application No. 11-36308. Examples of the electron donating compound are disclosed from paragraph [0051] to paragraph [0059] in Japanese Patent Application No. 11-36308. Electron donating colorless dyes for cyan, magenta and yellow color-forming dyes which can be used in combination with the electron donating compound when the light and heat sensitive recording material is used as a full color recording material in the present invention are disclosed in paragraph [0060] of Japanese Patent Application No. 11- 36308. The above-described electron donating colorless dye is preferably used in the range of 0.1 to 1 g/m$^2$ and more preferably in the range of 0.1 to 0.5 g/m$^2$. If the amount of the electron donating colorless dye to be used is less than 0.1 g/m$^2$, there may be a case in which color density cannot be sufficiently obtained. If the amount exceeds 1 g/m$^2$, a coating characteristic may deteriorate, which is not preferable.

Examples of the diazonium salt compound include compounds represented by the following formula,

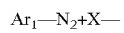

Ar$_1$—N$_2$+X— in which Ar$_1$ represents an aromatic ring and X— represents an acid anion.

The diazonium salt compound is a compound that causes a coupling reaction with the coupler when heated, so as to form color, and which is decomposed by light. The wavelength of maximum absorption of the diazonium salt compound can be controlled by varying positions and kinds of substituents at the Ar$_1$ portion thereof. In the present invention, the wavelength of maximum absorption λmax of the diazonium salt compound is preferably 450 nm or less, and more preferably 290 to 440 nm, in view of the effects of the present invention. Further, in the present invention, the diazonium salt compound preferably has at least 12 carbon atoms, solubility in water of 1% or less, and solubility in ethyl acetate of 5% or more. Specific examples of the diazonium salt compound which can be appropriately used include, but are not limited to, the compounds disclosed from paragraph [0064] to paragraph [0075] in Japanese Patent Application No. 11-36308.

The diazonium salt compound may be used alone or in a combination of two or more kinds, in accordance with purposes such as hue adjustment and the like. The amount of the diazonium salt compound used in the light and heat sensitive recording layer is preferably 0.01 to 3 g/m² and more preferably 0.02 to 1.0 g/m². If the amount of the diazonium salt compound is less than 0.01 g/m², sufficient color-forming ability cannot be obtained. An amount exceeding 3 g/m² is not preferable because sensitivity may decrease and a long fixing time may be required.

The substantially colorless compound B, which is used in the light and heat sensitive transfer layer (a) and has, within the same molecule, a polymerizable group and a site which reacts with the color-forming component A to form color, may be any compounds that reacts with the color-forming component A to form color, such as an electron accepting compound having a polymerizable group or a coupler compound having a polymerizable group or the like, and that reacts under light to be polymerized and cured.

The electron accepting compound having a polymerizable group, i.e., a compound having an electron accepting group and a polymerizable group in the same molecule, may be any compound that has a polymerizable group, reacts with the electron donating colorless dye, which is one form of the color-forming component A, to form color, and is able to cure the film by photopolymerization.

Examples of the electron accepting compound having a polymerizable group are compounds which are able to be synthesized with reference to the following compounds: 3-halo-4-hydroxybenzoic acid, disclosed in JP-A No. 4-226455; methacryloxyethylesters and acryloxyethylesters of benzoic acid having a hydroxy group, disclosed in JP-A No. 63-173682; esters of benzoic acid having a hydroxy group and hydroxymethylstyrene, disclosed in JP-A Nos. 59-83693, 60-141587 and 62-99190; hydroxystyrenes, disclosed in European Patent No. 29323; N-vinyl imidazole complexes of zinc halide, disclosed in JP-A Nos. 62-167077 and 62-16708; an electron accepting compound disclosed in JP-A No. 63-317558; and the like.

Among these compounds having an electron accepting group which reacts with the electron donating colorless dye and a polymerizable group in the same molecule, 3-halo-4-hydroxybenzoic acids represented by the following general formula, which are electron accepting compounds having a polymerizable group are preferable:

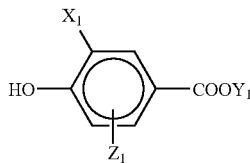

in which $X_1$ represents a halogen atom, preferably a chlorine atom. $Y_1$ represents a monovalent group having a polymerizable ethylene group. An aralkyl group having a vinyl group, an acryloyloxyalkyl group having a vinyl group, or a methacryloylalkyl group having a vinyl group is preferable. An acryloyloxyalkyl group having 5 to 11 carbon atoms or a methacryloyloxyalkyl group having 6 to 12 carbon atoms is more preferable. $Z_1$ represents a hydrogen atom, an alkyl group or an alkoxy group.

Another specific examples of the electron accepting compound having a polymerizable group include compounds disclosed from paragraph [0082] to paragraph [0087] in Japanese Patent Application No. 11-36308.

The electron accepting compound having a polymerizable group is used in combination with the electron donating colorless dye. In this case, the electron accepting compound is used in the range of 0.5 to 20 parts by weight, and more preferably in the range of 3 to 10 parts by weight, per one part by weight of the electron donating colorless dye to be used. If the amount of the electron accepting compound is less than 0.5 parts by weight, sufficient color-forming density cannot be obtained. An amount of the electron accepting compound exceeding 20 parts by weight is not preferable because sensitivity may decrease and the coating characteristic may deteriorate.

If the electron donating colorless dye and the electron accepting compound are used as color-forming components, in order to obtain a predetermined maximum coloring density, a method of selecting the kinds of the electron donating colorless dye and the electron accepting compound or a method of adjusting a coating amount of the formed recording layer may be utilized.

The coupler compound having a polymerizable group used in the light and heat sensitive recording layer (a) may be any compound that has a polymerizable group, reacts with the diazonium salt compound, which is one form of the color-forming component A, to form color, and can cure the film by photopolymerization. The coupler compound is coupled to a diazo compound under a basic atmosphere and/or a neutral atmosphere to form a dye. A plurality of kinds of coupler compound may be used in accordance with various purposes such as hue adjustment and the like. Specific examples of the coupler compound include, but are not limited to, compounds disclosed from paragraph [0090] to paragraph [0096] in Japanese Patent Application No. 11-36308. The coupler compound may be added to the light and heat sensitive recording layer (a) in the range of 0.02 to 5 g/m² and more preferably in the range of 0.1 to 4 g/m² in view of effects. An added amount of less than 0.02 g/m² is not preferable because the color-forming ability deteriorates, and an added amount exceeding 5 g/m² is not preferable because the coating characteristic deteriorates.

The coupler compound is used in combination with the diazonium salt compound. In this case, the coupler compound is preferably used in the range of 0.5 to 20 parts by weight and more preferably in the range of 1 to 10 parts by weight per one part by weight of the diazonium salt compound. If the amount of the coupler compound is less than 0.5 parts by weight, sufficient color-forming ability cannot be obtained. An amount of the coupler compound exceeding 20 parts by weight is not preferable because the coating characteristic deteriorates. The coupler compound may be employed by adding a water-soluble polymer together with other components and solid-dispersing with a sand mill or the like. Also, the coupler compound may be used as an emulsion by being emulsified together with an appropriate emulsion aid. Here, the method of solid-dispersing or emulsifying is not especially limited and conventional known methods may be used. Details of such methods are disclosed in JP-A Nos. 59-190886, 2-141279 and 7-17145.

In the light and heat sensitive recording layer (a), in order to accelerate the coupling reaction, organic bases such as tertiary amines, piperidines, piperazines, amidines, formamidines, pyridines, guanidines, morpholines and the like are preferably used. Specifically, these organic bases are disclosed in JP-A Nos. 57-123086, 60-49991, 60-94381, 9-71048, 9-77729, and 9-77737 and the like. The amount of the organic base used is not especially limited, but is preferably 1 to 30 mol per one mol of the diazonium salt compound.

Moreover, in order to accelerate the color-forming reaction, a color-forming aid may be added to the light and heat sensitive recording layer (a). Examples of the color-forming aid include phenol derivatives, naphthol derivatives, alkoxy-substituted benzenes, alkoxy-substituted naphthalenes, hydroxy compounds, carboxylic acid amide compounds, sulfonamide compounds and the like. These compounds have functions of decreasing the melting point of the coupler compound or the basic substance, or of enhancing the thermal-permeability of the microcapsule wall, and thus are considered to be compounds by which high color-forming density can be obtained.

In the light and heat sensitive recording layers (b) through (d), as the compound which reacts with the color-forming component A to form color, instead of the compound B, which has a polymerizable group, the substantially colorless compound C, which does not have a polymerizable group and which reacts with the color-forming component A to form color, may be used. Here, as the compound C does not have a polymerizable group, in order to have the recording layer cure by photopolymerization, the photo-polymerizable compound D having a polymerizable group is used.

As the compound C, any electron accepting compound or coupler compound which does not have a polymerizable group may be used. Any electron accepting compound which does not have a polymerizable group may be used that can react with the electron donating colorless dye, which is one form of the color-forming component A, to form color.

Examples of the electron accepting compound which does not have a polymerizable group include phenol derivatives, salycylic acid derivatives, metal salts of aromatic carboxylic acid, acid clay, bentonite, novolak resin, metal-treated novolak resin, metal complexes, and the like. Specific examples of the electron accepting compound which does not have a polymerizable group are disclosed in Japanese Patent Application Publication (JP-B) Nos. 40-9309 and 45-14039, JP-A Nos. 52-140483, 48-51510, 57-210886, 58-87089, 59-11286, 60-176795 and 61-95988, and the like. Other specific examples of the electron accepting compound which does not have a polymerizable group are disclosed from paragraph [0109] to paragraph [0110] in Japanese Patent Application No. 11-36308 and the like. The amount of the electron accepting compound which does not have a polymerizable group to be used is preferably 5 to 1,000% by weight based on the amount of the electron donating colorless dye to be used.

Any coupler compound which does not have a polymerizable group may be used that reacts with the diazonium salt compound, which is one type of the color-forming component A, so as to form color. The coupler compound which does not have a polymerizable group is a compound which couples to the diazonium salt compound under a basic atmosphere and/or a neutral atmosphere to form a dye. A plurality of kinds of coupler compound can be used in combination, in accordance with various purposes such as hue adjustment and the like. Examples of the coupler compound which does not have a polymerizable group include so-called active methylene compounds, which have a methylene group adjacent to a carbonyl group, phenol derivatives, naphthol derivatives and the like, and can be appropriately selected and used.

Specific examples of the coupler compound which does not have a polymerizable group include compounds disclosed from paragraph [0119] to paragraph [0121] in Japanese Patent Application No. 11-36308. Coupler compounds which do not have a polymerizable group are disclosed in JP-A Nos. 4-201483, 7-223367, 7-223368, 7-323660, 5-278608, 5-297024, 6-18669, 6-18670 and 7-316280, and the like. Reference can also be made to Japanese Patent Application Nos. 8-12610 and 8-30799, JP-A Nos. 9-216468, 9-216469, 9-319025, 10-35113, 10-19380 and 10-264532, which have been previously filed by the present applicant.

The coupler compound which does not have a polymerizable group is added to the light and heat sensitive recording layer (b), as in the case of the coupler compound which has a polymerizable group, in the range of 0.02 to 5 $g/m^2$ and more preferably in the range of 0.1 to 4 $g/m^2$ in view of effects. If the added amount is less than 0.02 $g/m^2$, sufficient color-forming density cannot be obtained. An added amount exceeding 5 $g/m^2$ is not preferable because the coating characteristic deteriorates. The coupler compound may be employed by adding a water-soluble polymer together with other components and solid-dispersing with a sand mill or the like. Also, the coupler compound may be used in an emulsion by being emulsified together with an appropriate emulsion aid. The method of solid-dispersing or emulsifying is not especially limited and conventional known methods may be used. Details of such methods are disclosed in JP-A Nos. 59-190886, 2-141279 and 7-17145.

In order to accelerate the coupling reaction in the light and heat sensitive recording layers (b) through (d), organic bases such as tertiary amines, piperidines, piperazines, amidines, formamidines, pyridines, guanidines, morpholines and the like are preferably used. The organic bases used here are the same bases as those used in the case of the coupler compound having a polymerizable group. The amount of the organic base to be used is also the same. With regard to color-forming aids, which are used in order to accelerate the color-forming reaction, the same ones as those in the case of the coupler compound having a polymerizable group can be used.

As the photo-polymerizable compound D, a photo-polymerizable monomer can be used. A photo-polymerizable monomer which has at least one vinyl group within a molecule may be used. In order to obtain a negative image, the photo-polymerizable compound Dp, which has a site for suppressing the reaction of the color-forming component A with the compound C, may be used as the photo-polymerizable compound. An appropriate photo-polymerizable compound Dp, i.e., a specific photo-polymerizable monomer (Dp1 or Dp2), is selected and used in accordance with the compound C to be used.

If the electron accepting compound which does not have a polymerizable group is used, the specific photo-polymerizable monomer Dp1 is used. The photo-polymerizable monomer Dp1 is preferably a photo-polymerizable monomer which has a reaction-inhibiting function for inhibiting the reaction between the electron donating colorless dye and the electron accepting compound and has at least one vinyl group within the molecule thereof.

Specific examples of the photo-polymerizable monomer include acrylic acid and salts thereof, acrylates, acrylamides; methacrylic acid and salts thereof, methacrylates, methacrylamides; anhydrous maleic acid, maleates; itaconic acid, itaconates; styrenes; vinyl ethers; vinyl esters; N-vinyl heterocyclic rings; arylethers; allylesters and the like. Among the aforementioned monomers, in particular, a photo-polymerizable monomer having a plurality of vinyl groups within the molecule is preferably used. Examples of such a photo-polymerizable monomer include acrylic esters and methacrylic esters of polyhydric alcohols such as trimethylolpropane and pentaerythritol and the like; acrylic esters and methacrylic esters of polyhydric phenols and bisphenols such as resorcinol, pyrogallol, phloroglucinol and the like; and acrylate-terminated or methacrylate-terminated epoxy resins, acrylate-terminated or methacrylate-terminated polyesters and the like. Among the aforementioned monomers, ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate and diethylene glycol dimethacrylate and the like are especially preferable.

The molecular weight of the photo-polymerizable monomer Dp1 is preferably about 100 to about 5,000 and more preferably about 300 to about 2,000. The photo-polymerizable monomer Dp1 is used preferably in the range of 0.1 to 10 parts by weight and more preferably in the range of 0.5 to 5 parts by weight per one part of the substantially colorless compound C which reacts with the color-forming component A to form color. If the amount of the monomer is less than 0.1 parts by weight, a latent image cannot be formed in the exposure process, and an amount of the monomer exceeding 10 parts by weight is not preferable because the color-forming density will decrease.

When the coupler compound which does not have a polymerizable group is used, the specific photo-polymerizable monomer Dp2 is used in combination therewith. The photo-polymerizable monomer Dp2 is preferably a photo-polymerizable monomer which has an acid group that has an inhibitory effect on the coupling reaction, and which is not a metallic salt compound. Examples of the photo-polymerizable monomer Dp2 include monomers disclosed from paragraph [0128] to paragraph [0130] in Japanese Patent Application No. 11-36308. The photo-polymerizable monomer Dp2 is used preferably in the range of 0.1 to 10 parts by weight and more preferably in the range of 0.5 to 5 parts by weights per one part by weight of the substantially colorless compound C which reacts with the color-forming component A to form color. If the amount of the monomer Dp2 is less than 0.1 parts by weight, a latent image cannot be formed in the exposure process and an amount of the monomer exceeding 10 parts by weight is not preferable because the color-forming density will decrease.

In the light and heat sensitive recording layers (b) through (d), an azomethine dye precursor may be used as the color-forming component A, and, as the compound C, a deprotective agent which generates an azomethine dye (thereby forming color) by contact with the azomethine dye precursor may be used. By using, as the photo-polymerizable compound, the photo-polymerizable compound (Dp) which has a site for suppressing the reaction of the azomethine dye precursor with the deprotective agent, a negative image can be obtained.

As the azomethine dye precursor, a compound represented by the following general formula (1) may be used:

General formula (1)

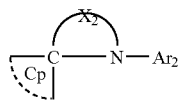

in which $Ar_2$ represents an aromatic ring group or a heterocyclic ring group which may have a substituent, and $X_2$ represents a bivalent connecting group. Cp represents a coupler residue which may form a ring.

Examples of the aromatic ring group, which may have a substituent, represented by $Ar_2$ include groups represented by the following structural formula (3), Structural formula (3)

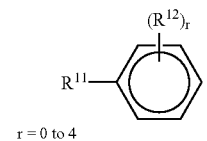

r = 0 to 4 in which $R^{11}$ represents a hydrogen atom, an alkyl group, an aryl group, a halogen atom, a cyano group, a nitro group, $SO_3H$, a heterocyclic ring group, $NR^{13}R^{14}$, $OR^{15}$, $CO_2H$, $SR^{15}$, $COR^{16}$, $CO_2R^{16}$, $SO_2R^{16}$, $SOR^{16}$, $CONR^{17}R^{18}$, or $SO_2NR^{17}R^{18}$. $R^{12}$ represents the same groups as $R^{11}$. $R^{11}$ and $R^{12}$ may bind to form a ring. If $R^{11}$ or $R^{12}$ represents a group having a dissociating proton, a salt may be formed. $R^{13}$ and $R^{14}$ represent a hydrogen atom, an alkyl group, an aryl group or a heterocyclic ring group. $R^{15}$ represents a hydrogen atom, $COR^{16}$, $CO_2R^{16}$, $SO_2R^{16}$, $CONR^{17}R^{18}$, an alkyl group or an aryl group. $R^{16}$ represents a hydrogen atom, an alkyl group, an aryl group or a heterocyclic ring group. $R^{17}$ and $R^{18}$ represent a hydrogen atom, an alkyl group, an aryl group or a heterocyclic ring group. r represents an integer of 0 to 4.

Examples of the heterocyclic ring group which may have substituents and which is represented by $Ar_2$ in general formula (1) include pyridine, pyrimidine, triazine, pyridazine, pyrazine, furan, thiophene, pyrrole, pyrazole, triazole, isoxyazole, isothiazole, imidazole, oxazole, thiazole and tetrazole. Examples of the substituents include the groups mentioned for $R^{11}$ and $R^{12}$.

In general formula (1), alkyl groups, aryl groups and heterocyclic ring groups represented by $R^{11}$ to $R^{18}$ may have further substituents. Examples of such substituents include an alkyl group, an aryl group, a hydroxy group, a nitro group, a cyano group, a halogen group, an alkylsulfonyl group, an arylsulfonyl group, an alkoxycarbonyl group, an aryloxycarbonyl group, an acyl group, an amino group, an alkylamino group, a dialkylamino group, an acylamino group, an alkylsulfonylamino group, an arylsulfonylamino group, a carbamoyl group, a sulfamoyl group, an alkylthio group, an arylthio group, a heterocyclic ring group, an arylamino group, a diarylamino group, an arylalkylamino group, an alkoxy group, and an aryloxy group. $Ar_2$ may bind to an aromatic ring or a heterocyclic ring. An alkyl group contained in $Ar_2$ may be a saturated, unsaturated or cyclic group.

Cp in general formula (1) represents a coupler residue. Any conventional known couplers used for silver photography or diazo heat-sensitive recording materials may be used. Examples of the coupler are described in Research Disclosure No. 17643, VII-C to G and No. 307105, VII-C to G. The coupler is desirably a coupler having non-diffusivity and a hydrophobic group, referred to as a ballast group, or a coupler which does not have the hydrophobic group or a coupler which is polymerized. Examples of a cyan coupler include naphthol couplers, phenol couplers and the like, and are disclosed in U.S. Pat. Nos. 2,369,929, 2,772,162, 2,801, 171, 2,895,826, 3,446,622, 3,758,308, 3,772,002, 4,052,212, 4,126,396, 4,146,396, 4,228,233, 4,254,212, 4,296,199, 4,296,200, 4,327,173, 4,333,999, 4,334,011, 4,343,011, 4,427,767, 4,451,559, 4,690,889 and 4,775,616, West German Patent Laid-Open No. 3,329, 729, European Patent Nos. 121,365A and 249,453A, JP-A No. 61-42658 and the like. Examples of a magenta coupler include imidazole

[1,2-b] pyrazoles disclosed in U.S. Pat. No. 4,500,630, pyrazolone [1,5-b] [1,2,4] triazoles disclosed in U.S. Pat. No. 4,540,654 and the like.

Other examples of the magenta coupler include a pyrazolotriazole coupler in which a branched alkyl group is bonded to the 2, 3 or 6 position of a pyrazolotriazole ring, disclosed in JP-A No. 61-65245; a pyrazoloazole coupler whose molecule includes a sulfonamide group, disclosed in JP-A No. 61-65246; a pyrazoloazole coupler which has an alkoxyphenylsulfonamide ballast group, disclosed in JP-A No. 61-147254; a pyrazolotriazole coupler which has an alkoxy group or an aryloxy group at the 6 position thereof, disclosed in European Patent (Laid-Open) Nos. 226,849 and 294,785. Further examples of the coupler include couplers disclosed in U.S. Pat. Nos. 3,061,432, 3,725,067, 4,310,619, 4,351,897 and 4,556,630, European Patent No. 73,636, JP-A Nos. 55-118034, 60-35730, 60-43659, 60-185951 and 61-72238, International Application No. WO88/04795, Research Disclosure Nos. 24220 and 24230, and the like. Examples of a yellow coupler are disclosed in U.S. Pat. Nos. 3,933,501, 3,973,968, 4,022,620, 4,248,961, 4,314,023, 4,326,024, 4,401,752, 4,511,649, European Patent No. 249, 473A, JP-B No. 58-10739, UK Patent Nos. 1,425,020 and 1,476,760, and the like. Typical examples of a polymerized dye-forming coupler are disclosed in U.S. Pat. Nos. 3,451, 820, 4,080,211, 4,367,282, 4,409,320 and 4,576,910, European Patent No. 341,188A, UK Patent No. 2,102,137 and the like. Other examples of such a polymerized dye-forming coupler are disclosed in Japanese Patent Application Nos. 9-260336 and 9-271395 and the like.

The bivalent connecting group represented by $X_2$ in general formula (1) is preferably a bivalent group represented by the following structural formula,

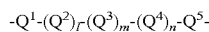

in which $Q^1$, $Q^2$, $Q^3$, $Q^4$ and $Q^5$ represent a connecting group for forming $X_2$, and l and m and n represent an integer of 0 or 1. Examples of $Q^1$, $Q^2$, $Q^3$, $Q^4$ and $Q^5$ include the following groups. $Q^1$ is positioned at a side at which a carbon atom is bonded and $Q^5$ is positioned at a side at which a nitrogen atom is bonded.

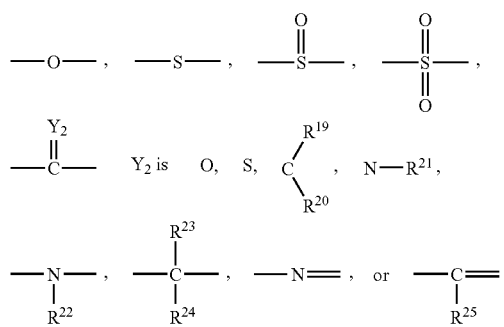

In the formulae $R^{19}$, $R^{20}$ and $R^{21}$ represent substituents. The substituents are the same as those represented by $R^{11}$. $R^{19}$, $R^{20}$ and $R^{21}$ may form a ring with other atoms in $X_2$. $R^{22}$ represents a substituent, the same as those represented by $R^{11}$. $R^{22}$ may form a ring with other atoms in $X_2$. $R^{23}$ and $R^{24}$ represent substituents, the same as those represented by $R^{11}$. $R^{23}$ and $R^{24}$ may form a ring with other atoms in $X_2$. $R^{25}$ represents a substituent, and examples of the substituent are the same as those represented by $R^{11}$. $R^{25}$ may form a ring with other atoms in $X_2$.

In the above structural formula, $Q^1$, $Q^2$, $Q^3$, $Q^4$ and $Q^5$ may form independently an aryl group or a heterocyclic ring group (i.e., an arylene group or a bivalent heterocyclic ring group). Examples of the aryl group include a phenyl group, a chlorophenyl group, a methoxyphenyl group, a naphthyl group and the like. Examples of the heterocyclic ring group include pyrazole, imidazole, triazole, tetrazole, pyridine, pyrimidine, triazine, pyridazine, pyrazine, furan, thiophene, pyrrole, isoxazole, isothiazole, oxazole, thiazole and the like. The aryl group or the bivalent heterocyclic ring group may have bonding hands at any positions thereof. The aryl group or the heterocyclic ring group may have a substituent and examples of such a substituent include an alkyl group, an aryl group, a hydroxy group, a nitro group, a cyano group, a halogen group, an alkylsulfonyl group, an arylsulfonyl group, an alkoxycarbonyl group, an aryloxycarbonyl group, an acyl group, an amino group, an alkylamino group, a dialkylamino group, an acylamino group, an alkylsulfonylamino group, arylsulfonylamino group, a carbamoyl group, a sulfamoyl group, an alkylthio group, an arylthio group, a heterocyclic ring group, an alkoxy group and an aryloxy group. The aryl group may bond to a heterocyclic ring, and the heterocyclic ring group may bond to an aromatic ring. The aryl group or the heterocyclic ring group may be bonded at any positions of the ring.

The heterocyclic ring groups in $Q^1$, $Q^2$, $Q^3$, $Q^4$ and $Q^5$ may form, as shown in the following formulae, a sulfonium salt, an oxonium salt or a quaternary salt.

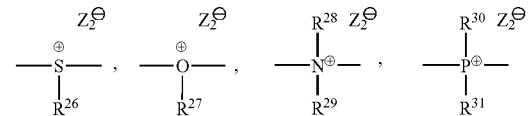

in which $R^{26}$ through $R^{31}$ represent an alkyl group or an aryl group, and examples of the alkyl group and the aryl group are the same as those represented by $R^{13}$ and $R^{14}$. $Z_2^-$ represents an anion. The anion may be an inorganic anion or an organic anion. Examples of the inorganic anion include a hexafluorophosphic acid ion, borofluoric hydroacid ion, chloride ion, bromide ion, hydrogensulfate ion and the like. Examples of the organic anion include a polyfluoroalkylsulfonic acid ion, polyfluoroalkylcarboxylic acid ion, tetraphenylboric acid ion, aromatic carboxylic acid ion, aromatic sulfonic acid ion and the like.

In general formula (1), a ring formed by $X_2$, a nitrogen atom and a carbon atom is preferably a five, six or seven member ring and more preferably a six member ring or a seven member ring. $Ar_2$ preferably has the following structure.

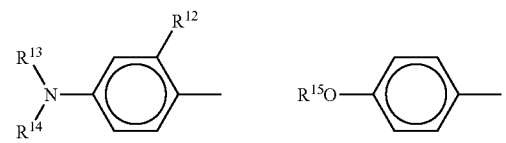

Cp preferably represents acylacetonitrides, pyrazolotriazoles, pyrazolones, pyridones, barbituric acids, pyrolotriazoles, naphtholes, phenols or imidazoles. $Q^1$ in $X_2$ preferably represents —O—, —S—, —N($R^{22}$)—, —N= or a bivalent heterocyclic ring, and $Q^5$ preferably represents —C(═O)— or —SO$_2$—. Further, combinations thereof are especially preferable.

Examples of the azomethine dye precursor represented by general formula (1) are described from paragraph [0052] to [0070] in Japanese Patent Application No. 2000-18425.

The deprotective agent is at least one kind selected from an acid, a base, an oxidizer, an alkylating agent and a metallic salt. Broadly, compounds having an active hydrogen may be used as the acid. The acid described herein refers to acids in a broad sense and includes, in addition to acids in a narrow sense, Lewis acids. Examples of the acid include organic acids including aliphatic carboxylic acid, aromatic carboxylic acid, sulfonic acids, phenols, naphthols, carbonamides, sulfonamides, ureas, thioureas, active methylene compounds. Examples of the base include organic bases including primary amines, secondary amines, tertiary amines, piperidines, piperazines, amidines, formamidines, pyridines, guanidines, morpholines and the like. A base precursor which generates the base may be used as the base. Here, the base refers to bases in a broad sense and includes, in addition to bases in a narrow sense, nucleophilic agents (Lewis bases). The base precursor is a compound which liberates a base when heated and examples of the base precursor include salts of bases and organic acids, and the like. Examples of the base which the base precursor forms preferably include those mentioned as bases. An ordinary Brønsted acid or Lewis acid may be used as the organic acid. A carboxylic acid which releases a base by a decarboxylation reaction may also be used. Sulfonyl acetic acid and propiolic acid are preferable because the decarboxylation reaction occurs easily therewith. It is preferable if the sulfonyl acetic acid or the propiolic acid has an aromatic substituent (an aryl group or an unsaturated heterocyclic ring group), because then the decarboxylation reaction further accelerates. A base precursor of sulfonyl acetic acid salt is disclosed in JP-A No. 59-168441, and a base precursor of propiolic acetic acid is specifically disclosed in JP-A No. 59-180537.

Examples of the oxidizer include quinones, including 2,3-dichloro-5,6-dicyano-1,4-benzoquinone and tetrachloro-1,4-benzoquinone; nitro compounds, including nitrobenzene and m-nitrobenzenesulfonic acid; nitroso compounds, including nitrosobenzene; cations, including triphenylcations; azo compounds, including diethyl azodicarbonate; nitroxides, including diphenylnitroxide, porphyroxide, 2,2,6,6-tetramethylpiperidine-1-oxyl; N-oxides including pyridine-N-oxide; peracids including sodium perchlorate, potassium periodate, m-chloroperbenzoic acid; halogens including bromine and iodine; hypochlorites including sodium hypochlorite; metallic oxides including manganese dioxide. The oxidizer may be used alone or in a combination of two or more kinds. Examples of the alkylating agent include alkyl halides such as alkyl iodide, alkyl bromide, alkylsulfuric acid, sulfonates and the like. These alkyl groups may further have substituents, and examples of the substituents include an alkoxycarbonyl group, an aryloxycarbonyl group, a carbamoyl group, a sulfonyl group, a sulfamoyl group, and an acyl group. Examples of the metallic salt include, besides metallic salts of aliphatic carboxylic acid and aromatic carboxylic acid which are mentioned as the acid, metallic salts of compounds including a mercapto group, a thione group or an imino group. Examples of the metallic atom include monovalent metals such as sodium, potassium, lithium, silver and the like; and multivalent metals such as zinc, magnesium, barium, calcium, aluminum, tin, titanium, nickel, cobalt, manganese, iron and the like. Especially, silver, zinc, aluminum, magnesium and calcium are preferable.

The content (mol) of the deprotective agent is 0.1 to 100 times, more preferably 0.5 to 30 times, as much as the content (mol) of the azomethine dye precursor.

In the photosensitive thermal recording layer (a), the azomethine dye precursor may be used as the color-forming component A, and the deprotective agent having a polymerizable group may be used as the compound B. A deprotective agent having a polymerizable group, such as an ethylene group or the like, within a molecule is preferable as the deprotective agent having a polymerizable group. Examples of the deprotective agent having a polymerizable group include a compound in which a polymerizable ethylene group, a (meth) acrylic group or a (meth) acrylamide group or the like is directly substituted with or substituted via a connecting group by the above-mentioned deprotective agent. Examples of such a deprotective agent are described in paragraphs [0234] to [0238] of Japanese Patent Application No. 2000-18425.

Examples of other combinations of color-forming component A and the compound B or C which reacts with the color-forming component A to form color include the following combinations (A) through (O). In each combination, the color-forming component A and then the compound B or C are mentioned, in that order.

(A) A combination of an organic acid metal salt, such as silver behenate, silver stearate or the like, and a reducer, such as protocatechinic acid, spiroindane, hydroquinone or the like.

(B) A combination of an iron salt of a long-chained fatty acid, such as iron (III) stearate, iron (III) myristinate or the like, and a phenol, such as tannic acid, gallic acid, ammonium salicylate or the like;

(C) A combination of a heavy metal salt of an organic acid, such as a nickel, cobalt, lead, copper, iron, mercury or silver salt of acetic acid, stearic acid, palmitic acid or the like, and an alkali metal or alkaline earth metal sulfide, such as calcium sulfide, strontium sulfide, potassium sulfide or the like; or a combination of a heavy metal salt of an organic acid and an organic chelating agent, such as s-diphenylcarbazide, diphenylcarbazone or the like.

(D) A combination of a heavy metal sulfate salt, such as a sulfate of silver, lead, mercury, sodium or the like, and a sulfur-containing compound, such as sodium tetrathionate, soda thiosulfate, thiourea or the like.

(E) A combination of an iron (III) salt of a fatty acid, such as iron (III) stearate, and an aromatic polyhydroxy compound, such as 3,4-hydroxytetraphenylmethane or the like.

(F) A combination of a metal salt of an organic acid, such as silver oxalate, mercury oxalate or the like, and an organic polyhydroxy compound, such as polyhydroxyalcohol, glycerin, glycol or the like.

(G) A combination of an iron (III) salt of a fatty acid, such as iron (III) pelargonate, iron (III) laurylate or the like, and a derivative of thiocesylcarbamide or isothiocesylcarbamide.

(H) A combination of a lead salt of an organic acid, such as lead caproate, lead pelargonate, lead behenate or the like, and a thiourea derivative, such as ethylenethiourea, N-dodecylthiourea or the like.

(I) A combination of a heavy metal salt of a higher fatty acid, such as iron (III) stearate, copper stearate or the like, and zinc dialkyldithiocarbamate.

(J) A combination which forms an oxazine dye, such as a combination of resorcinol and a nitroso compound.

(K) A combination of a formazan compound and a reducer and/or a metal salt.
(L) A combination of an oxidization-type color-forming agent and an oxidizer.
(M) A combination of a phthalonitrile and a diiminoisoindoline (i.e., a combination that generates phthalocyanine).
(N) A combination of an isocyanate and a diiminoisoindoline (i.e., a combination that generates a coloring pigment).
(O) A combination of a pigment precursor and an acid or a base (i.e., a combination that generates a pigment).

Among the above-mentioned combinations, the combination of an electron donating dye precursor and an electron accepting compound, a combination of a diazo compound and a coupler compound, a combination of a protected dye precursor and the deprotective agent, and a combination of a paraphenylene diamine derivative or para-aminophenol derivative oxidant precursor and a coupler compound are preferable. That is, as the color-forming component A, the electron donating dye precursor, the diazo compound, the protected dye precursor or the oxidant precursor is preferable. As the compound B or the compound C, the electron accepting compound, the coupler compound or the deprotective agent is preferable.

Next, the photopolymerization initiator used in the light and heat sensitive recording layers (a) through (d) will be explained. The photopolymerization initiator may be used in each of the light and heat sensitive recording layers (a) through (d). The photopolymerization initiator can generate radicals when exposed to light and thereby cause the polymerization reaction within the layer. Further, the photopolymerization initiator can accelerate the polymerization reaction. The recording layer film is cured by the polymerization reaction and thus a latent image of the desired image shape can be formed.

The photopolymerization initiator preferably contains a spectral sensitization compound which has a wavelength of maximum absorption in the range of 300 to 1,000 nm, and a compound that interacts with the spectral sensitization compound. If the compound that interacts with the spectral sensitization compound is a compound which has within its structure both a dye portion having a wavelength of maximum absorption in the range of 300 to 1,000 nm and a borate, the spectral sensitization compound is not required. If a color image is to be formed, it is preferable to use a light and heat sensitive recording material that has a light and heat sensitive recording layer which containing the photopolymerization initiator, which contains the spectral sensitization compound and the compound that interacts with the spectral sensitization compound.

As the spectral sensitization compound having a wavelength of maximum absorption at 300 to 1,000 nm, a spectral sensitization dye having a wavelength of maximum absorption in this wavelength range is preferable. High sensitivity can be obtained by selecting any desired dye from among spectral sensitization dyes of the aforementioned wavelength range, and adjusting the light-sensitivity wavelength to correspond to a light source to be used. The light source for image exposure can be appropriately selected from blue, green and red light sources and infrared lasers and the like. Accordingly, for example, in a case of forming a color image, in the light and heat sensitive recording material, which is formed by superposing monochrome light and heat sensitive recording layers that form the colors yellow, magenta and cyan, spectral sensitization dyes having different absorption wavelengths are present in the respective monochrome layers having different color-forming hues. By using light sources corresponding to the absorption wavelengths, because each layer (each color) in the recording material formed by superposing the plurality of layers has high sensitivity, an image with high sharpness can be formed. Thus, sensitivity enhancement and sharpness enhancement can be achieved for the whole multicolor light and heat sensitive recording material. Due to addition of the spectral sensitization dye, a desired color-forming density can be obtained at a lower energy.

Known compounds may be used as the spectral sensitization dye. Specific examples of the spectral sensitization dye include dyes disclosed in patent publications such as *Compounds which Interact with Spectral Sensitization Compounds*, described later, *Research Disclosure* (Vol. 200, December, 1980, Item 20036), *Sensitizers* (edited by Katsumi Tokumaru and Shin Ogawara, published by Kodansha Ltd. Publishers, pp. 160–163 (1987)) and the like. Specifically, a 3-ketocumarin compound disclosed in JP-A No. 58-15603, a thiopyrylium salt disclosed in JP-A No. 58-40302, naphthothiazol merocyanine compounds disclosed in JP-B Nos. 59-28328 and 60-53300, merocyanine compounds disclosed in JP-B Nos. 61-9621, 62-3842, and JP-A Nos. 59-89303 and 60-60104 may be used. Moreover, dyes described in *Chemistry of Functional Dyes* (published by CMC Publishers, pp. 393–416 (1981)), *Color Materials*, (60(4) 212–224 (1987)), and the like may also be used. Specific examples include cation methine dyes, cation carbonium dyes, cation quinone imine dyes, cation indoline dyes, cation styryl dyes and the like.

Examples of the spectral sensitization dye include keto dyes such as cumarin (including ketocumarin or sulfonocumarin) dyes, merostyryl dyes, oxonol dyes, hemioxonol dyes and the like; non-keto dyes such as non-ketopolymethine dyes, triarylmethane dyes, xanthene dyes, anthracene dyes, rhodamine dyes, acridine dyes, aniline dyes, azo dyes and the like; non-ketopolymethine dyes such as azomethine dyes, cyanine dyes, carbocyanine dyes, dicarbocyanine dyes, tricarbocyanine dyes, hemicyanine dyes, styryl dyes and the like; and quinone imine dyes such as azine dyes, oxazine dyes, thiazine dyes, quinoline dyes, thiazol dyes and the like. Further, dyes disclosed in Japanese Patent Application No. 2000-94431 may also be used.

By appropriately using the spectral sensitization dye, the spectral sensitivity of the photopolymerization initiator can be obtained in a range from UV light to infrared light. The above-mentioned various kinds of spectral sensitization dyes may be used alone or in a combination of two or more kinds. The amount of the spectral sensitization compound used in the light and heat sensitive recording layer is preferably 0.1 to 5% by weight and more preferably 0.5 to 2% by weight of the total amount of the light and heat sensitive recording layer.

One or two or more kinds of compounds which are able to start the photopolymerization reaction of the polymerizable group in the compound B or the compound D (a photo-polymerizable monomer) may be selected and used as the compound that interacts with the spectral sensitization compound. In particular, if this compound is used with the spectral sensitization compound, the compound will be highly sensitive to a light source for exposure that is in the spectral absorption wavelength range of the spectral sensitization compound. Accordingly, sensitivity enhancement can be achieved and generation of radicals can be controlled using a freely selected light source in a range from ultraviolet to infrared.

Specific examples of the compound that interacts with the spectral sensitization compound include organic borate salt compounds and compounds disclosed from paragraph [0145] to paragraph [0151] in Japanese Patent Application No. 11-36308. Among "compounds which interact with the spectral sensitization compound", organic borate compounds, benzoinethers, S-triazine derivatives having a trihalogen-substituted methyl group, organic peroxides and azinium salt compounds are preferable, and organic borate compounds are more preferable. By using the spectral sensitization compound and the "compound that interacts with the spectral sensitization compound" together, at the time of exposure, radicals can be locally and effectively generated at the exposed portions, and sensitivity enhancement can be achieved.

Examples of the organic borate compounds include organic borate compounds (which may be referred to as "borate compound I" hereinafter) disclosed in JP-A Nos. 62-143044, 9-188685, 9-188686, 9-188710 and the like, or spectral sensitization dye-based borate compounds (which may be referred to as "borate compound II" hereinafter) obtained from cation dyes and the like.

Specific examples of the borate compounds I include, but are not limited to, compounds disclosed from paragraph [0154] to paragraph [0163] in Japanese Patent Application No. 11-36308.

The spectral dye-based organic borate compounds (i.e., borate compounds II) obtained from cation dyes may be used as disclosed in *Chemistry of Functional Dyes* (published by CMC Publishers, pp. 393–416 (1981)), *Color Materials*, (60 (4) 212–224 (1987)) and the like. Specifically, any cation dyes may be appropriately used that have a wavelength of maximum absorption in the wavelength range of 300 nm or more, preferably in the wavelength range of 400 to 1100 nm. Among cation dyes, cation methine dyes, polymethine dyes, triaryl methane dyes, indoline dyes, azine dyes, xanthene dyes, cyanine dyes, hemicyanine dyes, rhodamine dyes, azamethine dyes, oxazine dyes, acridine dyes and the like are preferable. Cation cyanine dyes, hemicyanine dyes, rhodamine dyes, and azamethine dyes are more preferable. The borate compound II obtained from an organic cation dye can be obtained using the organic cation dye and an organic boron compound anion with reference to a method disclosed in European Patent No. 223,587A1. Specific examples of the borate compound II obtained from cation dyes include, but are not limited to, compounds disclosed from paragraph [0168] to paragraph [0174] in Japanese Patent Application No. 11-36308.

As described above, the borate compound II is a multifunctional compound. In view of obtaining high sensitivity and sufficient decolorizability, it is preferable that the photopolymerization initiator is formed by appropriately combining the spectral sensitization compound and the compound that interacts with the spectral sensitization compound. In this case, the photopolymerization initiator is more preferably a photopolymerization initiator (1), obtained by a combination of the spectral sensitization compound and borate compound I, or more preferably a photopolymerization initiator (2), obtained by a combination of borate compound I and borate compound II. At this time, the usage ratio of the spectral sensitization dye to the organic borate compound in the photopolymerization initiator is very important in view of obtaining sensitivity enhancement and sufficient decolorization due to irradiation of light in the fixing process.

In a case of the photopolymerization initiator (1), in the photopolymerization initiator, in addition to the ratio of the spectral sensitization compound to the borate compound I (=1/1: mole ratio) which ratio is required for the photopolymerization reaction, it is especially preferable that an amount of borate compound I necessary for sufficiently decolorizing the spectral sensitization compound which remains within the layer is added, in view of obtaining sensitivity enhancement and decolorizability. Namely, the ratio of the spectral sensitization dye/borate compound I is preferably 1/1 to 1/50, more preferably 1/1.2 to 1/30 and most preferably 1/1.2 to 1/20. If the ratio is less than 1/1, polymerization reactivity and decolorizability cannot be sufficiently obtained. A ratio of more than 1/50 is not preferable because the coating characteristic may deteriorate.

In the case of the photopolymerization initiator (2), it is especially preferable that the borate compound I and the borate compound II are used in combination such that the borate portion is at least in an equimolar ratio with respect to the dye portion, in view of obtaining sufficient sensitivity enhancement and decolorizability. The ratio of the borate compound I to the borate compound II is preferably 1/1 to 50/1, more preferably 1.2/1 to 30/1 and most preferably 1.2/1 to 20/1. If the ratio is less than 1/1, few radicals are generated, and sufficient polymerization reactivity and decolorizability cannot be obtained. A ratio exceeding 50/1 is not preferable because sensitivity cannot be sufficiently obtained.

The total amount of the spectral sensitization compound and the organic borate compound in the photopolymerization initiator is preferably 0.1 to 10% by weight, more preferably 0.1 to 5% by weight and most preferably 0.1 to 1% by weight, based on the amount used of the compound having a polymerizable group. If the total amount is less than 0.1% by weight, the effects of the present invention cannot be obtained. A total amount exceeding 10% by weight is not preferable because the storage stability may decrease and the coating characteristic may also decrease.

In order to accelerate the polymerization reaction, as an assistant, an oxygen scavenger or a reducing agent, such as a chain transfer agent of an active hydrogen donor or another compound which accelerates the polymerization in a chain-transfer manner, may be added to the photo-polymerizable composition of the light and heat sensitive recording materials (a) through (d). Examples of the oxygen scavenger include phosphines, phosphonates, phosphites, argentous salts and other compounds easily oxidized by oxygen. Specific examples of the oxygen scavenger include N-phenylglycine, trimethylbarbituric acid, N,N-dimethyl-2,6-diisopropylaniline, and N,N,N-2,4,6-pentamethylanilinic acid. Examples of useful polymerization accelerators include thiols, thioketones, trihalomethyl compounds, lophine dimer compounds, iodonium salts, sulfonium salts, azinium salts, organic peroxides and azides, and the like.

A protective layer may be provided in the light and heat sensitive recording material used with the present invention, if desired. The protective layer may be a single layer structure or may be a laminated structure of two or more layers.

Examples of materials used for the protective layer include water-soluble polymer compounds such as gelatin, polyvinyl alcohol, carboxy modified polyvinyl alcohol, vinyl acetate-acrylamide copolymer, silicon modified polyvinyl alcohol, starch, modified starch, methylcellulose, carboxymethylcellulose, hydroxymethylcellulose, gum arabic, casein, a styrene-maleic acid copolymer hydrolysate, a styrene-maleic acid copolymer half ester hydrolysate, an isobutylene-maleic anhydride copolymer hydrolysate, polyacrylamide derivatives, polyvinylpyrolidone, polystyrene sodium sulfonate, sodium alginate and the like; and latexes such as a styrene-butadiene rubber latex, an acrylonitrile-butadiene rubber latex, a methyl acrylate-butadiene rubber latex, a vinyl acetate emulsion and the like.

By cross-linking the water-soluble polymer compound used for the protective layer, storage stability can be further improved. In this case, a known cross-linking agent may be used as a cross-linking agent for cross-linking. Specific examples of the cross-linking agent include water-soluble initial condensates such as N-methylolurea, N-methylolmelamine, urea-formaline and the like, dialdehyde compounds such as glyoxal, glutaraldehyde and the like, inorganic cross-linking agents such as boric acid, borax and the like, and polyamide epichlorohydrine and the like.

Further, known pigments, metal soaps, waxes, surfactants and the like may be used in the protective layer. Known UV absorbents and UV absorbent precursors may be added. The coated amount of the protective layer is preferably 0.2 to 5 g/m$^2$ and more preferably 0.5 to 3 g/m$^2$.

The light and heat sensitive recording material used with the present invention is formed by superposing three light and heat sensitive recording layers, yellow, magenta and cyan, on a support. The light and heat sensitive recording material contains microcapsules which contain color-forming components having different color-forming hues. and photo-polymerizable compositions which are sensitive to lights of different wavelengths. Thus, a color image can be formed. By using the spectral sensitization compounds, each of which has a different absorption wavelength, the photo-polymerizable compositions which are sensitive to lights of different wavelengths can be formed. In this case, intermediate layers may be provided between the light and heat sensitive recording layers of the respective colors.

The light and heat sensitive recording layers of the multilayer light and heat sensitive recording material for color image formation may be obtained, for example, as follows. On a support is provided a first recording layer, which contains microcapsules which contain a color-forming component that forms the color yellow and a photo-polymerizable composition which is sensitive to a central wavelength $\lambda_1$ of a light source. On the first recording layer is provided a second recording layer, which contains microcapsules which contain a color-forming component that forms the color magenta and a photo-polymerizable composition which is sensitive to a central wavelength $\lambda_2$. On the second recording layer is provided a third recording layer, which contains microcapsules which contain a color-forming component that forms the color cyan and a photo-polymerizable composition which is sensitive to a central wavelength $\lambda_3$. A protective layer may be provided and intermediate layers may be provided between the respective recording layers, if necessary. The central wavelengths $\lambda_1$, $\lambda_2$ and $\lambda_3$ of the respective light sources are different from each other.

When image formation is carried out using this multilayer light and heat sensitive recording material for color image formation, in the exposure process, image exposure is carried out using a plurality of light sources having different wavelengths corresponding to the absorption wavelengths of the light and heat sensitive recording layers. As a result, the recording layers having the absorption wavelengths of the light sources selectively form respective latent images. Thus, a multicolor image having high sensitivity and high sharpness can be formed. Further, by irradiating the surface of the light and heat sensitive recording layer with light after transfer to an image receiving material, coloring of the background portion due to the photopolymerization initiator, such as the spectral sensitization compound remaining within the layers, can be decolorized, and an image with high contrast and high quality can be formed.

In the light and heat sensitive recording material used for the present invention, the electron donating colorless dye or diazonium salt compound (which hereinafter may be occasionally referred to as the color-forming component) is encapsulated in microcapsules before use. Examples of methods of microcapsulation include conventionally known methods.

Examples of these microencapsulation methods include methods described in: U.S. Pat. Nos. 2,800,457 and 2,800,458, in which coacervation of a hydrophilic wall forming material is utilized; U.S. Pat. No. 3,287,154, UK Patent No. 990443, and JP-B Nos. 38-19574, 42-446 and 42-771, and the like, in which interfacial polymerization is utilized; U.S. Pat. Nos. 3,418,250 and 3,660,304, in which precipitation of a polymer is utilized; U.S. Pat. No. 3,796,669, in which an isocyanate polyol wall material is utilized; U.S. Pat. No. 3,914,511, in which an isocyanate wall material is utilized; U.S. Pat. Nos. 4,001,140, 4,087,376, and 4,089,802, in which a urea/formaldehyde type or urea/formaldehyde/resorcinol type wall forming material is used; U.S. Pat. No. 4,025,455, in which a wall-forming material such as a melamine/formaldehyde resin, hydroxypropyl cellulose or the like is utilized; JP-B No. 36-9168 and JP-A No. 51-9079, in which in situ methods using monomer polymerization are utilized; UK Patent Nos. 952807 and 965074, in which an electrolytic dispersion and cooling method is utilized; U.S. Pat. No. 3,111,407 and UK Patent No. 930422, in which a spray drying method is utilized; and the like.

The microencapsulation methods are not limited to the aforementioned methods, but in the light and heat sensitive recording material used for the present invention, in particular, an interfacial polymerization method is preferably used. In this method, an oil phase, which is prepared by dissolving or dispersing a color-forming component in a hydrophobic organic solvent to serve as the core of the capsules, is mixed with an aqueous phase, in which a water-soluble polymer is dissolved, and this mixture is emulsified and dispersed by a homogenizer or the like. Then, a polymer-forming reaction is caused at the interface between the oil phase and the aqueous phase by heating, such that microcapsule walls can be formed of a polymer substance. That is, in the interfacial polymerization method, capsules with a uniform particle diameter can be formed within a short time, and a recording material with excellent raw storage stability can be obtained.

A reactant which forms the microcapsule wall of the polymer is added within oil droplets and/or outside the oil droplets. Specific examples of the polymer substance include polyurethane, polyurea, polyamide, polyester, polycarbonate, urea-formaldehyde resin, melamine resin, polystyrene, a styrene-methacrylate copolymer, a styrene-acrylate copolymer and the like. Among these polymer substances, polyurethane, polyurea, polyamide, polyester, and polycarbonate are preferable, and polyurethane and polyurea are especially preferable. The above-mentioned polymer substances may be used in a combination of two or more. Examples of the water-soluble polymer include gelatin, polyvinyl pyrolidone, polyvinyl alcohol and the like.

For example, when polyurethane is used as the capsule wall material, microcapsule walls are formed as follows. First, a polyhydric isocyanate and a second material (for example, a polyol or polyamine) which will react with the polyhydric isocyanate to form the microcapsule walls, are mixed with each other in a water-soluble polymer-aqueous solution (aqueous phase) or in an oil medium (oil phase)

which is to be encapsulated. Then, the mixture is emulsified and dispersed. Finally, by heating, the polymer forming reaction is caused at the interface between the aqueous phase and the oil phase, such that the microcapsule walls are formed. Examples of the polyhydric isocyanate and the polyol or polyamine which reacts with the polyhydric isocyanate include materials disclosed in U.S. Pat. No. 3,281,383, 3,773,695 and 3,793,268, JP-B Nos. 48-40347 and 49-24159, and JP-A Nos. 48-80191 and 48-84086.

When the microcapsules which contain the color-forming component are prepared, the encapsulated color-forming component may be present in the capsules in a liquid state or in a solid state. Examples of solvents which can be used are the same solvents as those used when emulsification-dispersing the photo-curable composition. If the electron donating colorless dye or diazonium salt compound is encapsulated in the capsules in a liquid state, the electron donating colorless dye or diazonium salt compound is encapsulated in a state in which it is dissolved in a solvent. In this case, the amount of the solvent is preferably 1 to 500 parts by weight per 100 parts by weight of the electron donating colorless dye. If the solubility of the electron donating colorless dye or diazonium salt compound to be encapsulated with respect to the solvent is low, a low-boiling-point solvent having high solubility may be used as an assistant. Examples of the low-boiling-point solvent include ethyl acetate, propyl acetate, isopropyl acetate, butyl acetate, methylene chloride and the like.

An aqueous solution in which the water-soluble polymer is dissolved is used as the aqueous phase. The oil phase is charged into the aqueous phase, and then emulsification dispersion is carried out by a homogenizer or the like. The water-soluble polymer enables uniform and easy dispersion, as well as acting as a dispersion medium which stabilizes the emulsification-dispersed aqueous solution. In order to carry out more uniform emulsification dispersion and stabilization, a surfactant may be added to at least one of the oil phase and the aqueous phase. Known surfactants for emulsions may be used as the surfactant. If the surfactant is added, the added amount of the surfactant is 0.1 to 5% and especially preferably 0.5 to 2% with respect to the amount by weight of the oil phase. As a surfactant contained in the aqueous phase, among anionic and ionic surfactants, a surfactant which acts as a protective colloid and does not cause precipitation or aggregation can be appropriately selected and used. Preferable examples of the surfactant include sodium alkyl benzene sulfonate, sodium alkyl sulfate, a sodium salt of dioctyl sulfosuccinate, polyalkylene glycol (for example, polyoxyethylene nonylphenylether) and the like.

As described above, the water-soluble polymer contained as the protective colloid in the aqueous phase mixed with the oil phase may be appropriately selected from known anionic polymers, nonionic polymers and amphoteric polymers. Examples of the anionic polymer include natural polymers and synthetic polymers, and for example, polymers having a —COO— or —$SO_2$— group and the like. Specific examples of anionic polymers include natural polymers such as gum arabic, alginic acid, pectin and the like; semi-synthetic products such as carboxymethylcellulose, gelatin derivatives such as gelatin phthalate and the like, starch sulfate, cellulose sulfate, lignin sulfonic acid and the like; synthetic products such as maleic anhydride (including hydrolysates) copolymers, acrylic acid (methacrylic acid) polymers and copolymers, vinylbenzenesulfonic acid polymers and copolymers, carboxy-modified polyvinylalcohols and the like. Examples of nonionic polymers include polyvinyl alcohol, hydroxyethyl cellulose, methylcellulose and the like. Examples of amphoteric polymers include gelatin and the like. Of these, gelatin, gelatin derivatives and polyvinyl alcohol are preferable. The water-soluble polymer is used as a 0.01 to 10% by weight aqueous solution.

All components contained in the light and heat sensitive recording layer such as the color-forming component can be used by being solid-dispersed together with, for example, a water-soluble polymer, a sensitizer and other color-forming aids and the like, by a sand mill or the like. However, it is preferable to dissolve the components in a slightly water-soluble or water-insoluble high-boiling-point organic solvent in advance, mix this solution with the polymer aqueous solution (aqueous phase) which contains the surfactant and/or the water-soluble polymer serving as the protective colloid, and use this mixed solution as an emulsified dispersion, which is emulsified using a homogenizer or the like. In this case, if necessary, a low-boiling-point solvent may be used as a dissolving aid. All components such as the aforementioned color-forming component can be emulsified and dispersed separately or can be mixed together in advance, dissolved in the high-boiling-point solvent and then emulsification dispersed. The diameter of the particles formed by emulsifying and dispersing is preferably 1 μm or less.

Emulsification can be easily carried out such that the oil phase containing the aforementioned components and the aqueous phase containing the protective colloid and the surfactant are mixed together using a usual means for emulsifying fine particles, such as high speed stirring, ultrasonic dispersing or the like, for example, a known emulsifying device such as a homogenizer, a Manton Gaulin, an ultrasonic disperser, a dissolver, a KADY mill or the like. After emulsifying, in order to accelerate the capsule wall formation reaction, the emulsion is heated to 30 to 70° C. During the reaction, in order to prevent aggregation of capsules, it is necessary to add water so as to decrease the incidence of capsule collisions, or to stir thoroughly. Further, during the reaction, a dispersion for preventing aggregation may be added separately. It will be observed that carbon dioxide gas is generated as the polymerization reaction proceeds. When generation of the carbon dioxide gas ends, it can be considered that the capsule wall formation reaction has finished. Usually, the microcapsules which encapsulate the desired dye are obtained by reacting for a few hours.

In the light and heat sensitive recording material used with the present invention, the average particle diameter of the microcapsules is preferably 20 μm or less and more preferably 5 μm or less in view of obtaining high resolution. If the diameter of the formed microcapsules is too small, the surface area with respect to a fixed amount of solids will be too large, and a large amount of the wall-forming material will be needed. Thus, the average particle diameter is preferably at least 0.1 μm.

If a color image is to be formed, the light and heat sensitive recording layers corresponding to the three hues of the light and heat sensitive recording material are formed such that monochrome light and heat sensitive recording layers are superposed on a support. The respective light and heat sensitive recording layers contain microcapsules which contain the electron donating colorless dyes that form color of the different hues and the photo-polymerizable compositions which contain the spectral sensitization dyes having different wavelengths of maximum absorption. When light is irradiated, the light and heat sensitive layers are sensitized by the different wavelengths of the light sources to form a multicolor image.

Intermediate layers may be provided between the respective monochrome light and heat sensitive recording layers for forming the light and heat sensitive recording layers. The intermediate layer is formed mainly of a binder and may contain, as necessary, additives such as a curing agent, a polymer latex and the like.

In the light and heat sensitive recording material used with the present invention, a binder for each of the layers, including the protective layer, the light and heat sensitive layers, the intermediate layers and the like can be, besides the binder used for emulsification dispersing the photopolymerizable composition and the water-soluble polymer used for encapsulating the color-forming component, a solvent-soluble high polymer such as polystyrene, polyvinylformal, or polyvinylbutyral; an acrylic resin, such as polymethyl acrylate, polybutyl acrylate, polymethyl methacrylate, polybutyl methacrylate and copolymers thereof; a phenol resin, a styrene/butadiene resin, ethyl cellulose, an epoxy resin, a urethane resin, or the like; and high polymer latexes of these can be used. Among these binders, gelatin and polyvinyl alcohol are preferable.

Various surfactants may be used for each light and heat sensitive recording layer of the light and heat sensitive recording material of the present invention, for purposes such as coating assistance, static prevention, lubricity improvement, emulsification for dispersion, adhesion prevention, and the like. Examples of surfactants include nonionic surfactants such as saponin and polyethylene oxide derivatives such as polyethylene oxide, alkyl ether of polyethylene oxide, and the like; anionic surfactants such as alkyl sulfonate, alkylbenzene sulfonate, alkylnaphthalene sulfonate, alkylsulfuric acid ester, N-acyl-N-alkyltaurines, sulfosuccinate ester, sulfoalkylpolyoxyethylenealkyl phenyl ether, and the like; amphoteric surfactants such as alkylbetaines, alkylsulfobetaines and the like; and cationic surfactants such as aliphatic or aromatic quaternary ammonium salts and the like.

In addition to the aforementioned additives, other additives may be added to the light and heat sensitive recording layers as necessary. Examples of the additives include a dye, a UV ray absorber, a plasticizer, a fluorescent whitening agent, a matting agent, a coating assistant, a curing agent, an antistatic agent, a slip-improving agent and the like. Typical examples of these additives are described in *Research Disclosure, Vol.* 176 (December, 1978, Item 17643) and *Research Disclosure, Vol.* 187 (November, 1979, Item 18716).

In the light and heat sensitive recording material of the present invention, a curing agent may be used, as necessary, in the respective layers, such as the light and heat sensitive recording layers, the intermediate layers, the protective layer and the like. In particular, it is preferable to use a curing agent in the protective layer, to decrease viscosity of the protective layer. Examples of the curing agent include "gelatin curing agents" used for manufacturing photographic photosensitive materials, such as formaldehyde-based compounds such as formaldehyde, glutaraldehyde and the like, a reactive halogen compound disclosed in U.S. Pat. No. 3,635,718, compounds having a reactive ethylene unsaturated group disclosed in U.S. Pat. No. 3,635,718, an azirizine-based compound disclosed in U.S. Pat. No. 3,017,280, an epoxy-based compound disclosed in U.S. Pat. No. 3,091,537, halogenocarboxyaldehydes such as mucochloric acid, dioxanes such as dihydroxydioxane, dichlorodioxane and the like, vinylsulfones disclosed in U.S. Pat. Nos. 3,642,486 and 3,687,707, vinylsulfone precursors disclosed in U.S. Pat. No. 3,841,872 and ketovinyls disclosed in U.S. Pat. No. 3,640,720. Examples of inorganic curing agents are chrome alum, zirconium sulfate, boric acid and the like. Among these curing agents, 1,3,5-triacryloyl-hexahydro-s-triazine, bisvinylsulfonyl-methane,
1,3-bis(vinylsulfonylmethyl)propanol-2, bis($\alpha$-vinylsulfonylacetoamide)ethane,
2,4-dichloro-6-hydroxy-s-triazine/sodium salt,
2,4,6-triethyleneimino-s-triazine, boric acid and the like are preferable. The added amount of the curing agent is preferably 0.5 to 5% by weight with respect to the amount of the binder.

The light and heat sensitive recording material used for the present invention can be formed such that after preparing coating liquids for the light and heat sensitive recording layers, a coating liquid for a heat-bonding layer and the like using means for dissolving the respective components in the solvents as necessary, the layers are coated on a desired support and dried.

Examples of a solvent used for preparation of a coating liquid include water; alcohols such as methanol, ethanol, n-propanol, isopropanol, n-butanol, sec-butanol, methyl cellosolve, and 1-methoxy-2-propanol; halogen solvents such as methylene chloride and ethylene chloride; ketones such as acetone, cyclohexanone, and methyl ethyl ketone; esters such as methyl acetate cellosolve, ethyl acetate, and methyl acetate; toluene; xylene, and the like. These solvents may be used either singly or in a combination of two or more. Among these, water is particularly preferable.

The coating liquid for each light and heat sensitive recording layer is applied to the support with a blade coater, a rod coater, a knife coater, a roll doctor coater, a reverse roll coater, a transfer roll coater, a gravure coater, a kiss roll coater, a curtain coater, an extrusion coater, or the like. The method of application may be effected with reference to *Research Disclosure, Vol.* 200 (December 1980, Item 20036, page XV) The thickness of the light and heat sensitive recording layer is preferably 0.1 to 50 μm and more preferably 5 to 35 μm.

Examples of the support used for the light and heat sensitive recording material of the present invention include paper; synthetic papers such as coated paper, laminated paper and the like; films such as polyethylene terephthalate film, cellulose triacetate film, polyethylene film, polystyrene film, polycarbonate film and the like; plates of metals such as aluminum, zinc, copper and the like; and supports on whose surfaces various treatments, such as surface processing, undercoating, metal deposition or the like, have been carried out. The supports disclosed in *Research Disclosure, Vol.* 200 (December, 1980, Item 20036, page XVII) may be used. Further, a polyurethane sheet, a rubber sheet or the like, which has inherent elasticity, may be used. Further, if necessary, an anti-halation layer may be provided on the surface of the support to be used. A sliding layer, an anti-static layer, a curl preventing layer, an adhesive layer and the like may be provided on a back surface of the support.

In the present invention, in addition to light and heat sensitive recording materials that have the above-described light and heat sensitive recording layers (a) through (d), light and heat sensitive recording materials including light and heat sensitive recording layers (e) and (f) may be appropriately used. The light and heat sensitive recording layers (e) and (f) are as follows.

The photo-curable light and heat sensitive layer (e) includes an oxidant precursor E which is encapsulated in thermally-responsive microcapsules, an activator G which exists outside the thermally-responsive microcapsules and which reacts with the oxidant precursor E to generate an oxidant F, and a dye forming coupler H which couples to the oxidant F to generate a dye. By irradiation of light, an irradiated portion of the light and heat sensitive recording layer (e) is cured.

The light and heat sensitive recording layer (f) includes the oxidant precursor E, outside the thermally-responsive microcapsules, the activator G which is encapsulated in the thermally-responsive microcapsules and which reacts with the oxidant precursor E to generate the oxidant F, and the dye forming coupler H which couples to the oxidant F to form a dye. By irradiation of light, an irradiated portion is cured.

In the light and heat sensitive recording layer (e), by carrying out exposure of the desired image shape, the irradiated portion is cured and a latent image of the desired image shape is formed. Next, the activator G present in the unexposed portion moves within the recording material due to heating, and reacts with the oxidant precursor E within the capsules to generate the oxidant F. The generated oxidant F couples to the dye forming coupler H to form a dye (to form color). Accordingly, the light and heat sensitive recording layer (e) is a positive light and heat sensitive recording layer in which color is not formed at the exposed portion and uncured portions, the unexposed portion, form color so that an image is formed. Examples of such a light and heat sensitive recording layer include a light and heat sensitive recording layer disclosed in Japanese Patent Application No. 11-324548, which layer contains a para-phenylenediamine derivative or para-aminophenol derivative oxidant precursor which is encapsulated in microcapsules, a dye forming coupler, an activator which exists outside the microcapsules and which reacts with the oxidant precursor to form a para-phenylenediamine derivative or para-aminophenol derivative oxidant, a photo-polymerizable monomer, and a photopolymerization initiator. In this light and heat sensitive recording layer, the photo-polymerizable monomer is polymerized and cured by exposure, so that a latent image is formed. Thereafter, the activator present at the unexposed portion moves within the recording material when heated, and reacts with the para-phenylenediamine derivative or para-aminophenol derivative oxidant precursor within the microcapsules to generate, within the microcapsules, the para-phenylenediamine derivative or para-aminophenol derivative oxidant, which is a color-forming developing agent. The color-forming developing agent oxidant further reacts with the dye forming coupler within the microcapsules to form color. Thus, color is not formed at the cured latent image portion of the exposed portion and only the uncured portions form color, so that a positive image with high contrast and high sharpness can be formed.

In the light and heat sensitive recording layer (f), by effecting exposure of the desired image shape, the irradiated portion of the layer is cured, so that a latent image of the desired image shape is formed. Next, the oxidant precursor E present at the unexposed portion moves within the recording material during heating, and reacts with the activator G within the microcapsules to generate the oxidant F. The generated oxidant F couples to the dye forming coupler H to form a dye (to form color). Accordingly, the light and heat sensitive recording layer (f) is a positive light and heat sensitive recording layer in which color is not formed at the exposed portion and color is formed at the uncured portions, the unexposed portion, so that an image is formed. Specific examples of such a light and heat sensitive recording layer include a light and heat sensitive recording layer disclosed in Japanese Patent Application No. 11-324548, which layer contains a para-phenylenediamine derivative or para-aminophenol derivative oxidant precursor outside microcapsules, an activator which is encapsulated in the microcapsules and which reacts with the oxidant precursor to generate a para-phenylenediamine derivative or para-aminophenol derivative oxidant, a dye-forming coupler, a photo-polymerizable monomer, and a photopolymerization initiator. In this light and heat sensitive recording layer, the photo-polymerizable monomer is polymerized and cured by exposure, so that a latent image is formed. Thereafter, the para-phenylenediamine derivative or para-aminophenol derivative oxidant precursor which exists at the unexposed portion is moved within the recording material by heating, and reacts with the activator within the microcapsules so as to generate, within the microcapsules, the para-phenylenediamine derivative or para-aminophenol derivative oxidant, which is a color-forming developing agent. The color-forming developing agent oxidant further reacts with the dye-forming coupler within the microcapsules to form color. Accordingly, color is not formed at the cured latent image portion of the exposed portion, and only the uncured portions form color, so that a positive image with high contrast and high sharpness can be formed.

Hereinafter, components for forming the above-described light and heat sensitive recording layers (e) and (f) will be explained in detail. The oxidant F generated in the light and heat sensitive recording layers (e) and (f) is a color-forming developing agent oxidant. As the oxidant precursor E, a compound represented by the following general formula (2) may be used:

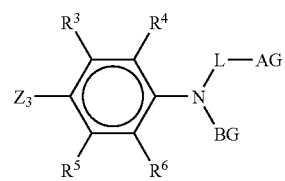

General formula (2)

in which $Z_3$ represents a hydroxyl group or $-NR^1R^2$, and $R^1$ and $R^2$ each represents an alkyl group or an aryl group. Examples of $R^1$ and $R^2$ include a methyl group, an ethyl group, a propyl group, a dodecyl group, a 2-hydroxyethyl group, 2-cyanoethyl group, a cyanomethyl group, a 2-methoxyethyl group, a 2-ethoxycarbonylethyl group, a 2-(methylsulfonylamino) ethyl group, a phenyl group, a naphthyl group, and the like. $R^1$ and $R^2$ may bind to form a hetero ring. In this case, the ring is preferably a five member ring, a six member ring or a seven member ring. If $Z_3$ represents a hydroxyl group, the hydroxyl group may be protected and used, if necessary. $R^3$, $R^4$, $R^5$ and $R^6$ each represents a hydrogen atom or a substituent. If $R^3$, $R^4$, $R^5$ or $R^6$ represents the substituent, examples of such a substituent include a halogen atom, an alkyl group, an aryl group, a hetero ring group a carbonamide group, a sulfonamide group, an alkoxy group, an aryloxy group, an alkylthio group, an arylthio group, an amino group, a carbamoyl group, a sulfamoyl group, a cyano group, a sulfonyl group, an alkoxycarbonyl group, an aryloxycarbonyl group, an acyl group, a ureido group, a urethane group, an acyloxy group and the like. $R^1$ and $R^3$, $R^1$ and $R^5$, $R^2$ and $R^3$ and $R^2$ and $R^5$ may bond with each other to form a hetero ring. In this case, the hetero ring is preferably a five member ring, a six member ring or a seven member ring. Further, $R^3$ and $R^4$, and $R^5$ and $R^6$ may bind with each other to form a ring. In this case, the ring may be a hetero ring or may be a carbon ring. Further, the ring may be a saturated ring, a partially unsaturated ring or an unsaturated ring, and the number of members in the ring is preferably five, six or seven.

-L-AG corresponds to the protective group, and AG represents a group which can interact with the activator. Examples of such a group include a carboxy group, a thiocarbonyl group, a selenocarbonyl group, a tellurocarbonyl group, a thioether group, a selenoether group, an amino group, an ether group, a hydroxy group (including enol and phenol), a carboamide group, a polyether group, a crown ether group, an azo group, a hydroxyimino group, an imino group, a carbonyl group, a hetero ring group containing a nitrogen atom or a sulfur atom within the ring, and the like. Among these, the carboxyl group, the thiocarbonyl group, the thioether group, the amino group, the hydroxy (including enol and phenol) group, the polyether group, the crown ether group, the hydroxyimino group, the imino group, and the hetero ring group including a nitrogen atom or a sulfur atom within the ring are more preferable. Further, the carboxyl group, the thiocarbonyl group, the amino group, the hydroxyimino group, and the hetero ring group including a nitrogen atom or a sulfur atom within the ring are most preferable. The aforementioned groups may be used in combination. A group which has the partial structure represented by the following general formula (3) is most preferable as AG:

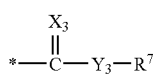

General formula (3)

in which ★ represents a site which combines with L. $X_3$ represents a sulfur atom, a selenium atom or an =NOH group. $Y_3$ represents a sulfur atom, an oxygen atom, —N($R^8$)— or —C($R^9$) ($R^{10}$)—. More preferably, $Y_3$ represents a sulfur atom, an oxygen atom or —N($R^8$)—. $R^7$ represents an alkyl group, an aryl group or a hetero ring group. $R^8$, $R^9$ and $R^{10}$ each represents an alkyl group, an aryl group or a hetero ring group. $R^7$ and $R^8$, $R^7$ and $R^9$, $R^7$ and $R^{10}$, and $R^9$ and $R^{10}$ may bind with each other to form a ring. In this case, the number of members in the ring is preferably five, six or seven.

L represents a group which leaves with a bonding electron pair from a nitrogen atom in general formula (2) as a result of interaction between the compound represented by the general formula (2) and the activator. Preferably, L preferably represents a sulfur atom, —N($R^{41}$)— or —C($R^{42}$) ($R^{43}$)—. $R^{41}$ represents an alkyl group, an aryl group, a hetero ring group or a bonding arm. $R^{41}$ may bond to AG to form a ring. In this case, a preferable number of members in the ring is five, six or seven. $R^{42}$ and $R^{43}$ represent an alkyl group, an aryl group, a hetero ring group, a cyano group, a trifluoromethyl group, a sulfonyl group, a carbamoyl group, a halogen atom, an amide group, a sulfamoyl group, an acyl group or a bonding arm. $R^{42}$ and $R^{43}$, $R^{42}$ and AG, and $R^{43}$ and AG may bind with each other to form a ring. In this case, a preferable number of members in the ring is five, six or seven. At least one of $R^{42}$ and $R^{43}$ represents a group having a Hammett constant $\sigma_p$ (sigma para) of at least +0.3 (preferably a cyano group, a trifluoromethyl group, a sulfonyl group, a carbamoyl group or a sulfamoyl group, an acyl group or the like).

In general formula (2), BG represents a block group, a group which is liberated in a process of dye formation. BG also has a function of stabilizing the compound represented by general formula (2) and, in view of this function, preferably represents an electron attractive group. Preferable examples of BG include groups represented by the general formula (4),

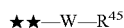—W—$R^{45}$   General formula (4)

in which ★★ represents a position at which BG binds to a nitrogen atom in general formula (2). W represents a bivalent group having an electron attractive property, such as —SO₂—, —CON($R^{45}$)—, —COO— or —SO₂N($R^{45}$)—. $R^{45}$ represents a hydrogen atom, an alkyl group or an aryl group, of which the hydrogen atom is preferable. W represents most preferably —CON($R^{45}$)—. $R^{44}$ represents a hydrogen atom, an alkyl group, an aryl group, a hetero ring group or an alkoxy group, more preferably represents an alkyl group or an aryl group, and most preferably represents an alkyl group.

The amount of the oxidant precursor E used for one color is preferably in a range of 0.01 to 5 mmol/m² and more preferably in a range of 0.1 to 2 mmol/m². Specific examples of the oxidant precursor E represented by general formula (2) are described from paragraph [0015] to paragraph [0023] in Japanese Patent Application No. 11-324548.

Next, the activator G is explained. The activator G reacts with the para-phenylenediamine derivative or para-aminophenol derivative oxidant precursor to generate the para-phenylenediamine derivative or para-aminophenol derivative oxidant. Examples of the activator include an electrophilic agent and, especially, an electrophilic agent which utilizes a nucleophilic substitution reaction or a nucleophilic addition reaction of the oxidant precursor with a carbon atom contained in the electrophilic agent. Examples of such an activator include substances having structures represented by the following general formulae:

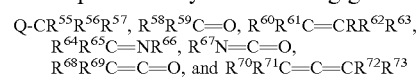

in which Q represents an atom or a group which is liberated by a nucleophilic reaction of AG of the oxidant precursor E represented by general formula (2) with respect to a carbon atom to which Q binds. Examples of Q include a halogen atom, an alkylsulfoxyl group, an arylsulfoxyl group, and a carbamoyloxyl group. $R^{55}$ to $R^{73}$ represent a halogen atom or a substituent. Preferably at least one of $R^{60}$ to $R^{63}$ represents an electron attractive group. Preferably at least one of each of $R^{55}$ to $R^{57}$, $R^{58}$ to $R^{59}$, and $R^{64}$ to $R^{66}$, and at least two of $R^{60}$ to $R^{63}$ represents an electron attractive group. Further, the activator preferably has at least one polymerizable group.

Another preferable example of the activator G is a compound represented by general formula (5),

   General Formula (5)

in which M represents a metallic atom having an electric charge of b valence, and a represents an integer from 0 to 7. Preferable examples of the metallic atom which is preferable as M include titanium, vanadium, chromium, manganese, iron, cobalt, nickel, copper, zinc, zirconium, molybdenum, ruthenium, rhodium, palladium, silver, cadmium, mercury, tin, tungsten, rhenium, osmium, iridium, platinum, gold, mercury, thallium, lead and uranium.

$A_1$ represents an atomic group which neutralizes the electric charge of the metallic atom. Examples of $A_1$ include organic anions such as carboxylic acid anions, sulfonic acid anions, sulfuric acid mono ester anions, phosphoric acid diester anions, β-ketoester anions, β-diketone anions, oxime anions, hydroxamic acid anions, tetraphenyl boric acid anions, and inorganic anions such as a phosphorus 6-fluoride anion, phosphorus 4-fluoride anion or the like.

In general formula (5), if b=0, $A_1$ need not neutralize the electric charge of M, and a represents 0 to 6. At this time, $A_1$ preferably represents a phosphine such as triphenyl phosphine. Specific examples of the above-described activator G are described in paragraph [0025] and from paragraph [0029] to paragraph [0032] of JP-A No. 11-324548.

Examples of the activator G include compounds represented by general formula (6),

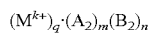
$\qquad\qquad\qquad$ General Formula (6)

in which M represents a metallic atom having an electric charge of k valence. k represents an integer from 0 to 7. q represents an integer from 1 to 24. $A_2$ represents an atomic group which has a negative electric charge from 1 to 7 valence and which neutralizes the electric charge of the metallic atom M. m represents an integer from 0 to 24. If m is at least 2, each $A_2$ may be the same as or may be different from each other $A_2$, and may connect with each other. $B_2$ represents an atomic group represented by the following general formula (7), and n represents an integer from 1 to 24:

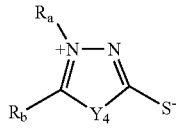
$\qquad\qquad\qquad$ General formula (7)

in which $Y_4$ represents O, S or N—$R_c$, and $R_a$ and $R_c$ represent substituents. $R_b$ represents a hydrogen atom or a substituent.

If n represents at least 2, each $B_2$ may be the same as or may be different from each other $B_2$, and may connect with each other. The compound represented by general formula (6) may further be bound to an atomic group which does not substantially neutralize other electric charges.

As the dye forming coupler H, couplers which are known as four-equivalent couplers and two-equivalent couplers in the field of silver halide photography photosensitive materials may be used. A two-equivalent coupler is preferable. In the oxidant precursor E represented by general formula (2), if W in BG is —$SO_2$—, a four-equivalent coupler is preferably used. With regard to such a dye forming coupler H, the coupler description in JP-A No. 8-286340 may be applied and disclosed couplers may be preferably used. More preferable examples of the coupler may also be used. Specific examples of compounds in JP-A No. 8-286340 may also be used.

The oxidant precursor E and the dye forming coupler H may be used at a freely selected molar ratio. The molar ratio (oxidant precursor/dye forming coupler) is preferably 0.01 to 100, more preferably 0.1 to 10 and most preferably 0.5 to 5. The oxidant precursor E and the activator G may be used at a freely selected molar ratio. The molar ratio (activator/oxidant precursor) is preferably 0.1 to 100, more preferably 0.2 to 50 and most preferably 0.5 to 50. Two or more kinds of each of the oxidant precursor E, the activator G and the dye forming coupler H may be mixed together and used.

As in the light and heat sensitive recording layers (b) to (d), by adding the photo-polymerizable compound D and the photopolymerization initiator to the light and heat sensitive recording layers (e) and (f), a photo-curable light and heat sensitive recording layer can be formed. Further, a photo-curable light and heat sensitive recording layer can also be formed by making one of the oxidant precursor E, the activator G and the dye forming coupler H have a polymerizable group. By using, as the photo-polymerizable compound, the photo-polymerizable compound Dp, which has a strong interaction with either the oxidant F or the dye forming coupler H, a negative image can be obtained.

The same photo-polymerizable compound D and the photopolymerization initiator as those used in the light and heat sensitive recording layers (b) to (d) may be used. Additives for the light and heat sensitive recording layer, structures of layers other than the light and heat sensitive recording layer and encapsulating methods have been already described.

What is claimed is:

1. An image-recording apparatus comprising:
  a casing section which encases a light and heat sensitive recording material;
  an optical recording section, downstream of the casing section, which exposes the light and heat sensitive recording material to visible light, which has been fed from the casing section, for recording a latent image;
  a thermal developing section, downstream of the optical recording section, which develops the latent image by heating; and
  an optical fixing section, downstream of the thermal developing section, which irradiates visible light for fixing the developed image wherein the light and heat sensitive recording material is provided with a light and heat sensitive recording layer containing:
  a color-forming component A encapsulated in heat-responsive microcapsules; and
  a photo-polymerizable composition outside the heat-responsive microcapsules, the photo-polymerizable composition including at least a substantially colorless compound B, which has in one molecule a polymerizable group and a site capable of reacting with the color-forming component A to form color, and a photo-polymerization initiator.

2. The image-recording apparatus as claimed in claim 1, wherein the optical recording section records the latent image with recording light having an intensity maximum at at least one wavelength selected from a wavelength range of 300 to 1100 nm.

3. The image-recording apparatus as claimed in claim 2, wherein a maximum irradiation energy of the recording light on the surface of the light and heat sensitive recording material is from 0.01 to 50 mJ/cm².

4. The apparatus according to claim 1, wherein the thermal developing apparatus comprises non-contact heating.

5. The image-recording apparatus as claimed in claim 1, wherein the thermal developing section develops with a heating temperature of 50 to 200° C.

6. The image-recording apparatus as claimed in claim 1, wherein the optical fixing section fixes with light having intensity so as to provide an illumination of 10,000 to 50,000,000 lux.

7. The image-recording apparatus as claimed in claim 1, wherein the thermal developing section heats such that a range of variation with respect to a heating temperature setting is at most ±5° C.

8. The apparatus of claim 1, wherein the casing section, the optical recording section, the thermal developing section and the optical fixing section are arranged in a vertical configuration.

9. The apparatus of claim 1, wherein the image recording relates only to processing of a single sheet.

10. The apparatus of claim 1, wherein the optical recording section uses at least a short wavelength light source that has an intensity maximum in a wavelength range of 300–450 nm.

11. The image-recording apparatus as claimed in claim 10, wherein the short wavelength light source is a semiconductor laser.

12. The image-recording apparatus as claimed in claim 11, wherein the semiconductor laser is a Group III element nitride semiconductor laser.

13. The image-recording apparatus as claimed in claim 10, wherein the optical recording section exposes, for recording the latent image, using the short wavelength light source and another light source, whose intensity maximum wavelength is different from the intensity maximum of the short wavelength light source.

14. The image-recording apparatus as claimed in claim 13, wherein the other light source is selected from the group consisting of semiconductor lasers, solid state lasers, fiber lasers, wavelength conversion solid state lasers, and gas lasers.

15. An image-recording apparatus comprising:
a casing section which encases a light and heat sensitive recording material;
an optical recording section, downstream of the casing section, which exposes the light and heat sensitive recording material to visible light, which has been fed from the casing section, for recording a latent image;
a thermal developing section, downstream of the optical recording section, which develops the latent image by heating; and
an optical fixing section, downstream of the thermal developing section, which irradiates visible light for fixing the developed image wherein the light and heat sensitive recording material is provided with a light and heat sensitive recording layer containing:
a color-forming component A encapsulated in heat-responsive microcapsules; and
a photo-polymerizable composition outside the heat-responsive microcapsules, the photo-polymerizable composition including at least a substantially colorless compound C capable of reacting with the color-forming component A to form color, a photo-polymerizable compound D, and a photo-polymerization initiator.

16. The image-recording apparatus as claimed in claim 15, wherein the optical recording section records the latent image with recording light having an intensity maximum at at least one wavelength selected from a wavelength range of 300 to 1100 nm.

17. The image-recording apparatus as claimed in claim 16, wherein a maximum irradiation energy of the recording light on the surface of the light and heat sensitive recording material is from 0.01 to 50 mJ/cm$^2$.

18. The apparatus according to claim 15, wherein the thermal developing apparatus comprises non-contact heating.

19. The image-recording apparatus as claimed in claim 15, wherein the thermal developing section develops with a heating temperature of 50 to 200° C.

20. The image-recording apparatus as claimed in claim 15, wherein the optical fixing section fixes with light having intensity so as to provide an illumination of 10,000 to 50,000,000 lux.

21. The image-recording apparatus as claimed in claim 15, wherein the thermal developing section heats such that a range of variation with respect to a heating temperature setting is at most ±5° C.

22. The apparatus of claim 15, wherein the casing section, the optical recording section, the thermal developing section and the optical fixing section are arranged in a vertical configuration.

23. The apparatus of claim 15, wherein the image recording relates only to processing of a single sheet.

24. The apparatus of claim 15, wherein the optical recording section uses at least a short wavelength light source that has an intensity maximum in a wavelength range of 300–450 nm.

25. The image-recording apparatus as claimed in claim 24, wherein the short wavelength light source is a semiconductor laser.

26. The image-recording apparatus as claimed in claim 25, wherein the semiconductor laser is a Group III element nitride semiconductor laser.

27. The image-recording apparatus as claimed in claim 24, wherein the optical recording section exposes, for recording the latent image, using the short wavelength light source and another light source, whose intensity maximum wavelength is different from the intensity maximum of the short wavelength light source.

28. The image-recording apparatus as claimed in claim 27, wherein the other light source is selected from the group consisting of semiconductor lasers, solid state lasers, fiber lasers, wavelength conversion solid state lasers, and gas lasers.

29. An image-recording apparatus comprising:
a casing section which encases a light and heat sensitive recording material;
an optical recording section, downstream of the casing section, which exposes the light and heat sensitive recording material to visible light, which has been fed from the casing section, for recording a latent image;
a thermal developing section, downstream of the optical recording section, which develops the latent image by heating; and
an optical fixing section, downstream of the thermal developing section, which irradiates visible light for fixing the developed image wherein the light and heat sensitive recording material is provided with a light and heat sensitive recording layer containing:
a substantially colorless compound C that is encapsulated in heat-responsive microcapsules and is capable of reacting with a color-forming component A to form color; and
a photo-polymerizable composition outside the heat-responsive microcapsules, the photo-polymerizable composition including at least the color-forming component A, a photo-polymerizable compound D, and a photo-polymerization initiator.

30. The image-recording apparatus as claimed in claim 29, wherein the optical recording section records the latent image with recording light having an intensity maximum at at least one wavelength selected from a wavelength range of 300 to 1100 nm.

31. The image-recording apparatus as claimed in claim 30, wherein a maximum irradiation energy of the recording light on the surface of the light and heat sensitive recording material is from 0.01 to 50 mJ/cm$^2$.

32. The apparatus according to claim 29, wherein the thermal developing apparatus comprises non-contact heating.

33. The image-recording apparatus as claimed in claim 29, wherein the thermal developing section develops with a heating temperature of 50 to 200° C.

34. The image-recording apparatus as claimed in claim 29, wherein the optical fixing section fixes with light having intensity so as to provide an illumination of 10,000 to 50,000,000 lux.

35. The image-recording apparatus as claimed in claim 29, wherein the thermal developing section heats such that a range of variation with respect to a heating temperature setting is at most ±5° C.

36. The apparatus of claim 29, wherein the casing section, the optical recording section, the thermal developing section and the optical fixing section are arranged in a vertical configuration.

37. The apparatus of claim 29, wherein the image recording relates only to processing of a single sheet.

38. The apparatus of claim 29, wherein the optical recording section uses at least a short wavelength light source that has an intensity maximum in a wavelength range of 300–450 nm.

39. The image-recording apparatus as claimed in claim 38, wherein the short wavelength light source is a semiconductor laser.

40. The image-recording apparatus as claimed in claim 39, wherein the semiconductor laser is a Group III element nitride semiconductor laser.

41. The image-recording apparatus as claimed in claim 38, wherein the optical recording section exposes, for recording the latent image, using the short wavelength light source and another light source, whose intensity maximum wavelength is different from the intensity maximum of the short wavelength light source.

42. The image-recording apparatus as claimed in claim 41, wherein the other light source is selected from the group consisting of semiconductor lasers, solid state lasers, fiber lasers, wavelength conversion solid state lasers, and gas lasers.

43. An image-recording apparatus comprising:
a casing section which encases a light and heat sensitive recording material;
an optical recording section, downstream of the casing section, which exposes the light and heat sensitive recording material to visible light, which has been fed from the casing section, for recording a latent image;
a thermal developing section, downstream of the optical recording section, which develops the latent image by heating; and
an optical fixing section, downstream of the thermal developing section, which irradiates visible light for fixing the developed image wherein the light and heat sensitive recording material is provided with a photo-curable light and heat sensitive recording layer which contains:
an oxidant precursor E encapsulated in heat-responsive microcapsules;
an activator G outside the heat-responsive microcapsules, the activator G being capable of reacting with the oxidant precursor E to form an oxidant F; and
a dye-forming coupler H capable of coupling with the oxidant F to form a dye,
and wherein light irradiation cures an irradiated portion of the light and heat sensitive recording layer.

44. The image-recording apparatus as claimed in claim 43, wherein the optical recording section records the latent image with recording light having an intensity maximum at at least one wavelength selected from a wavelength range of 300 to 1100 nm.

45. The image-recording apparatus as claimed in claim 44, wherein a maximum irradiation energy of the recording light on the surface of the light and heat sensitive recording material is from 0.01 to 50 mJ/cm$^2$.

46. The apparatus according to claim 43, wherein the thermal developing apparatus comprises non-contact heating.

47. The image-recording apparatus as claimed in claim 43, wherein the thermal developing section develops with a heating temperature of 50 to 200° C.

48. The image-recording apparatus as claimed in claim 43, wherein the optical fixing section fixes with light having intensity so as to provide an illumination of 10,000 to 50,000,000 lux.

49. The image-recording apparatus as claimed in claim 43, wherein the thermal developing section heats such that a range of variation with respect to a heating temperature setting is at most ±5° C.

50. The apparatus of claim 43, wherein the casing section, the optical recording section, the thermal developing section and the optical fixing section are arranged in a vertical configuration.

51. The apparatus of claim 43, wherein the image recording relates only to processing of a single sheet.

52. The apparatus of claim 43, wherein the optical recording section uses at least a short wavelength light source that has an intensity maximum in a wavelength range of 300–450 nm.

53. The image-recording apparatus as claimed in claim 52, wherein the short wavelength light source is a semiconductor laser.

54. The image-recording apparatus as claimed in claim 53, wherein the semiconductor laser is a Group III element nitride semiconductor laser.

55. The image-recording apparatus as claimed in claim 52, wherein the optical recording section exposes, for recording the latent image, using the short wavelength light source and another light source, whose intensity maximum wavelength is different from the intensity maximum of the short wavelength light source.

56. The image-recording apparatus as claimed in claim 55, wherein the other light source is selected from the group consisting of semiconductor lasers, solid state lasers, fiber lasers, wavelength conversion solid state lasers, and gas lasers.

57. An image-recording apparatus comprising:
a casing section which encases a light and heat sensitive recording material;
an optical recording section, downstream of the casing section, which exposes the light and heat sensitive recording material to visible light, which has been fed from the casing section, for recording a latent image;
a thermal developing section, downstream of the optical recording section, which develops the latent image by heating; and
an optical fixing section, downstream of the thermal developing section, which irradiates visible light for fixing the developed image wherein the light and heat sensitive recording material is provided with a photo-curable light and heat sensitive recording layer which contains:
- an oxidant precursor E outside heat-responsive microcapsules;
- an activator G encapsulated in the heat-responsive microcapsules, the activator G being capable of reacting with the oxidant precursor E to form an oxidant F; and
- a dye-forming coupler H capable of coupling with the oxidant F to form a dye,
and wherein light irradiation cures an irradiated portion of the light and heat sensitive recording layer.

58. The image-recording apparatus as claimed in claim 57, wherein the optical recording section records the latent image with recording light having an intensity maximum at at least one wavelength selected from a wavelength range of 300 to 1100 nm.

59. The image-recording apparatus as claimed in claim 58, wherein a maximum irradiation energy of the recording light on the surface of the light and heat sensitive recording material is from 0.01 to 50 mJ/cm².

60. The apparatus according to claim 57, wherein the thermal developing apparatus comprises non-contact heating.

61. The image-recording apparatus as claimed in claim 57, wherein the thermal developing section develops with a heating temperature of 50 to 200° C.

62. The image-recording apparatus as claimed in claim 57, wherein the optical fixing section fixes with light having intensity so as to provide an illumination of 10,000 to 50,000,000 lux.

63. The image-recording apparatus as claimed in claim 57, wherein the thermal developing section heats such that a range of variation with respect to a heating temperature setting is at most ±5° C.

64. The apparatus of claim 57, wherein the casing section, the optical recording section, the thermal developing section and the optical fixing section are arranged in a vertical configuration.

65. The apparatus of claim 57, wherein the image recording relates only to processing of a single sheet.

66. The apparatus of claim 57, wherein the optical recording section uses at least a short wavelength light source that has an intensity maximum in a wavelength range of 300–450 nm.

67. The image-recording apparatus as claimed in claim 66, wherein the short wavelength light source is a semiconductor laser.

68. The image-recording apparatus as claimed in claim 67 wherein the semiconductor laser is a Group III element nitride semiconductor laser.

69. The image-recording apparatus as claimed in claim 66, wherein the optical recording section exposes, for recording the latent image, using the short wavelength light source and another light source, whose intensity maximum wavelength is different from the intensity maximum of the short wavelength light source.

70. The image-recording apparatus as claimed in claim 69, wherein the other light source is selected from the group consisting of semiconductor lasers, solid state lasers, fiber lasers, wavelength conversion solid state lasers, and gas lasers.

71. An image-recording apparatus comprising:
- a casing section which encases light and heat sensitive recording material;
- an optical recording section, downstream of the casing section, which exposes, using at least a short wavelength light source that has an intensity maximum in a wavelength range of 300 to 450 nm, the light and heat sensitive recording material, which has been fed from the casing section, for recording a latent image;
- a thermal developing section, downstream of the optical recording section, which develops the latent image by heating; and
- an optical fixing section, downstream of the thermal developing section, which irradiated visible light for fixing the developed image,
wherein the thermal developing apparatus comprises non-contact heating wherein the thermal developing apparatus comprises a far infrared heat source, and
wherein the light and heat sensitive recording material is provided with a light and heat sensitive recording layer containing:
- a color-forming component A encapsulated in heat-responsive microcapsules; and
- a photo-polymerizable composition outside the heat-responsive microcapsules, the photo-polymerizable composition including at least a substantially colorless compound B, which has in one molecule a polymerizable group and a site capable of reacting with the color-forming component A to form color, and a photo-polymerization initiator.

72. The image-recording apparatus as claimed in claim 71, wherein a maximum irradiation energy of the recording light on the surface of the light and heat sensitive recording material is from 0.01 to 50 mJ/cm².

73. The image-recording apparatus as claimed in claim 71, wherein the thermal developing section develops with a heating temperature of 50 to 200° C.

74. The image-recording apparatus as claimed in claim 71, wherein the optical fixing section fixes with light having intensity so as to provide an illumination of 10,000 to 50,000,000 lux.

75. The image-recording apparatus as claimed in claim 71, wherein the thermal developing section heats such that a range of variation with respect to a heating temperature setting is at most ±5° C.

76. The apparatus of claim 71, wherein the casing section, the optical recording section, the thermal developing section and the optical fixing section are arranged in a vertical configuration.

77. The apparatus of claim 71, wherein the image recording relates only to processing of a single sheet.

78. The image-recording apparatus as claimed in claim 71, wherein the short wavelength light source is a semiconductor laser.

79. The image-recording apparatus as claimed in claim 78, wherein the semiconductor laser is a Group III element nitride semiconductor laser.

80. The image-recording apparatus as claimed in claim 71, wherein the optical recording section exposes, for recording the latent image, using the short wavelength light source and another light source, whose intensity maximum wavelength is different from the intensity maximum of the short wavelength light source.

81. The image-recording apparatus as claimed in claim 80, wherein the other light source is selected from the group consisting of semiconductor lasers, solid state lasers, fiber lasers, wavelength conversion solid state lasers, and gas lasers.

82. An image-recording apparatus comprising:
- a casing section which encases a light and heat sensitive recording material;

an optical recording section, downstream of the casing section, which exposes the light and heat sensitive recording material to visible light, which has been fed from the casing section, for recording a latent image;

a thermal developing section, downstream of the optical recording section, which develops the latent image by heating; and an optical fixing section, downstream of the thermal developing section, which irradiates visible light for fixing the developed image provided with a cutter after said optical fixing section, wherein the optical recording section uses at least a short wavelength light source that has an intensity maximum in a wavelength range of 300–450 nm, wherein the short wavelength light source is a semiconductor laser, and wherein the semiconductor laser is a Group III element nitride semiconductor laser.

83. An image-recording apparatus comprising:

a casing section which encases light and heat sensitive recording material;

an optical recording section, downstream of the casing section, which exposes, using at least a short wavelength light source that has an intensity maximum in a wavelength range of 300 to 450 nm, the light and heat sensitive recording material, which has been fed from the casing section, for recording a latent image;

a thermal developing section, downstream of the optical recording section, which develops the latent image by heating; and an optical fixing section, downstream of the thermal developing section, which irradiated visible light for fixing the developed image, wherein the thermal developing apparatus comprises non-contact heating wherein the thermal developing apparatus comprises a far infrared heat source, and wherein the light and heat sensitive recording material is provided with a light and heat sensitive recording layer containing:

a color-forming component A encapsulated in heat-responsive microcapsules; and a photo-polymerizable composition outside the heat-responsive microcapsules, the photo-polymerizable composition including at least a substantially colorless compound C capable of reacting with the color-forming component A to form color, a photo-polymerizable compound D, and a photo-polymerization initiator.

84. The image-recording apparatus as claimed in claim 83, wherein a maximum irradiation energy of the recording light on the surface of the light and heat sensitive recording material is from 0.01 to 50 mJ/cm$^2$.

85. An image-recording apparatus comprising:

a casing section which encases light and heat sensitive recording material;

an optical recording section, downstream of the casing section, which exposes, using at least a short wavelength light source that has an intensity maximum in a wavelength range of 300 to 450 nm, the light and heat sensitive recording material, which has been fed from the casing section, for recording a latent image;

a thermal developing section, downstream of the optical recording section, which develops the latent image by heating; and an optical fixing section, downstream of the thermal developing section, which irradiated visible light for fixing the developed image, wherein the thermal developing apparatus comprises non-contact heating wherein the thermal developing apparatus comprises a far infrared heat source, and wherein the light and heat sensitive recording material is provided with a light and heat sensitive recording layer containing:

a substantially colorless compound C that is encapsulated in heat-responsive microcapsules and is capable of reacting with a color-forming component A to form color; and a photo-polymerizable composition outside the heat-responsive microcapsules, the photo-polymerizable composition including at least the color-forming component A, a photo-polymerizable compound D, and a photo-polymerization initiator.

86. The image-recording apparatus as claimed in claim 85, wherein a maximum irradiation energy of the recording light on the surface of the light and heat sensitive recording material is from 0.01 to 50 mJ/cm$^2$.

87. An image-recording apparatus comprising:

a casing section which encases light and heat sensitive recording material;

an optical recording section, downstream of the casing section, which exposes, using at least a short wavelength light source that has an intensity maximum in a wavelength range of 300 to 450 nm, the light and heat sensitive recording material, which has been fed from the casing section, for recording a latent image;

a thermal developing section, downstream of the optical recording section, which develops the latent image by heating; and an optical fixing section, downstream of the thermal developing section, which irradiated visible light for fixing the developed image, wherein the thermal developing apparatus comprises non-contact heating wherein the thermal developing apparatus comprises a far infrared heat source, and wherein the light and heat sensitive recording material is provided with a photo-curable light and heat sensitive recording layer which contains:

an oxidant precursor E encapsulated in heat-responsive microcapsules;

an activator G outside the heat-responsive microcapsules, the activator G being capable of reacting with the oxidant precursor E to form an oxidant F; and a dye-forming coupler H capable of coupling with the oxidant F to form a dye, and wherein light irradiation cures an irradiated portion of the light and heat sensitive recording layer.

88. The image-recording apparatus as claimed in claim 87, wherein a maximum irradiation energy of the recording light on the surface of the light and heat sensitive recording material is from 0.01 to 50 mJ/cm$^2$.

89. An image-recording apparatus comprising:

a casing section which encases light and heat sensitive recording material;

an optical recording section, downstream of the casing section, which exposes, using at least a short wavelength light source that has an intensity maximum in a wavelength range of 300 to 450 nm, the light and heat sensitive recording material, which has been fed from the casing section, for recording a latent image;

a thermal developing section, downstream of the optical recording section, which develops the latent image by heating; and an optical fixing section, downstream of the thermal developing section, which irradiated visible light for fixing the developed image, wherein the thermal developing apparatus comprises non-contact heating wherein the thermal developing apparatus comprises a far infrared heat source, and wherein the light and heat sensitive recording material is provided with a photo-curable light and heat sensitive recording layer which contains:

an oxidant precursor E outside heat-responsive microcapsules;

an activator G encapsulated in the heat-responsive microcapsules, the activator G being capable of reacting with the oxidant precursor E to form an oxidant F; and a dye-forming coupler H capable of coupling with the oxidant F to form a dye, and wherein light irradiation cures an irradiated portion of the light and heat sensitive recording layer.

90. The image-recording apparatus as claimed in claim 89, wherein a maximum irradiation energy of the recording light on the surface of the light and heat sensitive recording material is from 0.01 to 50 $mJ/cm^2$.

* * * * *